(12) United States Patent
Fukunaga et al.

(10) Patent No.: US 10,767,258 B2
(45) Date of Patent: Sep. 8, 2020

(54) HARD TITANIUM ALUMINUM NITRIDE COATING, HARD-COATED TOOL, AND THEIR PRODUCTION METHODS

(71) Applicant: Mitsubishi Hitachi Tool Engineering, Ltd., Tokyo (JP)

(72) Inventors: Yuuzoh Fukunaga, Narita (JP); Masayuki Imai, Narita (JP)

(73) Assignee: MITSUBISHI HITACHI TOOL ENGINEERING, LTD., Tokyo (JP)

( * ) Notice: Subject to any disclaimer, the term of this patent is extended or adjusted under 35 U.S.C. 154(b) by 157 days.

(21) Appl. No.: 15/770,946

(22) PCT Filed: Nov. 18, 2016

(86) PCT No.: PCT/JP2016/084346
§ 371 (c)(1),
(2) Date: Apr. 25, 2018

(87) PCT Pub. No.: WO2017/090540
PCT Pub. Date: Jun. 1, 2017

(65) Prior Publication Data
US 2018/0305811 A1  Oct. 25, 2018

(30) Foreign Application Priority Data
Nov. 25, 2015  (JP) ................ 2015-229505

(51) Int. Cl.
*B23B 27/14* (2006.01)
*C23C 16/34* (2006.01)
(Continued)

(52) U.S. Cl.
CPC ............ *C23C 16/34* (2013.01); *B23B 27/148* (2013.01); *C23C 16/45502* (2013.01);
(Continued)

(58) Field of Classification Search
USPC ................ 51/307, 309; 427/255.23, 255.28, 427/255.32, 255.34, 255.391, 255.394;
(Continued)

(56) References Cited

U.S. PATENT DOCUMENTS

| 7,767,320 B2 | 8/2010 | Endler |
| 8,257,841 B2 | 9/2012 | Endler et al. |

(Continued)

FOREIGN PATENT DOCUMENTS

| DE | 102014103220 A1 | 9/2015 |
| JP | H04124272 A | 4/1992 |

(Continued)

OTHER PUBLICATIONS

International Search Report dated Dec. 27, 2016, issued for PCT/JP2016/084346.

(Continued)

*Primary Examiner* — Archene A Turner
(74) *Attorney, Agent, or Firm* — Locke Lord LLP

(57) ABSTRACT

A titanium aluminum nitride coating having a columnar crystal structure, which is formed on a substrate, comprises high-Al TiAlN having an fcc structure, which has a composition represented by $(Ti_{x_1}, Al_{y_1})N$, wherein $x_1$ and $y_1$ are numbers meeting $x_1=0.005$-$0.1$, and $y_1=0.995$-$0.9$ by atomic ratio, and network-like, high-Ti TiAlN having an fcc structure, which has a composition represented by $(Ti_{x_2}, Al_{y_2})N$, wherein $x_2$ and $y_2$ are numbers meeting $x_2=0.5$-$0.9$, and $y_2=0.5$-$0.1$ by atomic ratio; the high-Al TiAlN being surrounded by the network-like, high-Ti TiAlN.

18 Claims, 11 Drawing Sheets

(51) Int. Cl.
*C23C 16/455* (2006.01)
*C23C 28/04* (2006.01)

(52) U.S. Cl.
CPC .. *C23C 16/45514* (2013.01); *C23C 16/45578* (2013.01); *C23C 28/042* (2013.01); *C23C 28/044* (2013.01); *B23B 2228/10* (2013.01)

(58) Field of Classification Search
USPC ................................ 428/325, 697, 698, 699
See application file for complete search history.

(56) References Cited

U.S. PATENT DOCUMENTS

| | | |
|---|---|---|
| 2009/0123779 A1 | 5/2009 | Endler |
| 2010/0233511 A1 | 9/2010 | Endler et al. |
| 2015/0345013 A1 | 12/2015 | Paseuth et al. |
| 2016/0333473 A1* | 11/2016 | Stiens ..................... C23C 16/34 |
| 2016/0333478 A1 | 11/2016 | Tatsuoka et al. |
| 2017/0113285 A1 | 4/2017 | Tatsuoka et al. |

FOREIGN PATENT DOCUMENTS

| | | |
|---|---|---|
| JP | 2001341008 A | 12/2001 |
| JP | 2008545063 A | 12/2008 |
| JP | 2011500964 A | 1/2011 |
| JP | 2014129562 A | 7/2014 |
| JP | 2014133267 A | 7/2014 |
| JP | 2015163424 A | 9/2015 |
| JP | 2015193071 A | 11/2015 |
| WO | 2015105177 A1 | 7/2015 |

OTHER PUBLICATIONS

C. Czettl et al., "CVD TiAlN—Development and challenges for use in mass production" ResearchGate, 19th Plansee Seminar, Conference Paper, Jun. 2017, pp. 45/1-45/13 and a cover page. (cited in the Jun. 3, 2019 Search Report issued for 16868487.6).

Supplementary European Search Report dated Jun. 3, 2019, issued for the European patent application No. 16868487.6.

* cited by examiner

HARD TITANIUM ALUMINUM NITRIDE COATING, HARD-COATED TOOL, AND THEIR PRODUCTION METHODS

FIELD OF THE INVENTION

The present invention relates to a hard titanium aluminum nitride coating having excellent wear resistance and oxidation resistance, a hard-coated tool, and their production methods.

BACKGROUND OF THE INVENTION

Cutting tools having single- or multi-layered hard coatings of TiAlN, TiC, TiN, Ti(CN), $Al_2O_3$, etc. are conventionally used to cut heat-resistant alloy steel, stainless steel, etc. With increasingly severer use conditions of such hard-coated tools, cutting tools undergo extremely high cutting edge temperatures during, for example, high-speed cutting of soft steel. At cutting edges subjected to high temperatures, the crystal structures of the hard coatings are changed to lower hardness, suffering crater wear on rake faces and thus shorter lives. To overcome such problems, cutting tools having hard coatings with better wear resistance and oxidation resistance at high temperatures are desired.

JP 2001-341008 A discloses a cutting tool having a hard titanium aluminum nitride coating containing 0.01-2% by mass of chlorine and having an fcc structure, the coating being formed on a WC-based cemented carbide substrate by a thermal CVD method at 700-900° C., using a titanium halide gas, an aluminum halide gas and an $NH_3$ gas as starting material gases. It has been found, however, that because the hard titanium aluminum nitride coating of JP 2001-341008 A has a fine granular crystal structure, it exhibits low oxidation resistance when used at high temperatures, resulting in a short life.

JP 2008-545063 A discloses a hard-coated tool having a hard titanium aluminum nitride coating having an fcc structure with a lattice constant of 0.412-0.405 nm, which has a composition represented by $Ti_{1-x}Al_xN$ ($0.75 < x \le 0.93$) and is formed by a thermal CVD method on a substrate, or a multi-phase coating comprising a main phase of titanium aluminum nitride and other phases. It has been found, however, that because the hard titanium aluminum nitride coating of JP 2008-545063 A also has a granular crystal structure, it exhibits low oxidation resistance when used at high temperatures, resulting in a short life.

JP 2014-129562 A discloses a tool covered with a hard titanium aluminum nitride coating having a multi-layer structure by a CVD apparatus 100 shown in FIG. 14. The CVD apparatus 100 comprises pluralities of shelves 103, on which pluralities of substrates 102 are set, a reaction vessel 104 covering the shelves 103, a temperature-controlling cover 105 surrounding the reaction vessel 104, a supply pipe 108 having two inlets 106, 107, and a discharge pipe 109. The hard titanium aluminum nitride coating has a structure in which first and second unit layers having hard grains of TiAlN, AlN or TiN are alternately laminated on a WC-based cemented carbide substrate. This is because (1) first and second starting material gases (mixture gases) are ejected into the furnace through nozzles positioned at equal distance from a center of the supply pipe 108 in just opposite directions (180°); and because (2) different starting material gases from those in the present invention are used. It has been found that the hard titanium aluminum nitride coating having a laminate structure suffers interlayer delamination at high temperatures because of thermal expansion coefficient difference between the layers due to composition difference; and that it exhibits largely decreased oxidation resistance because of a fine crystal grain structure when used at high temperatures, resulting in a short life.

OBJECTS OF THE INVENTION

Accordingly, the first object of the present invention is to provide a long-life, hard titanium aluminum nitride coating having excellent wear resistance and oxidation resistance.

The second object of the present invention is to provide a tool coated with such a hard titanium aluminum nitride coating.

The third object of the present invention is to provide methods for producing such hard titanium aluminum nitride coating and hard-coated tool.

DISCLOSURE OF THE INVENTION

The hard titanium aluminum nitride coating of the present invention has a columnar crystal structure, and comprises high-Al TiAlN having an fcc structure, which has a composition represented by $(Ti_{x_1}, Al_{y_1})N$, wherein $x_1$ and $y_1$ are numbers meeting $x_1 = 0.005$-$0.1$, and $y_1 = 0.995$-$0.9$ by atomic ratio, and network-like, high-Ti TiAlN having an fcc structure, which has a composition represented by $(Ti_{x_2}, Al_{y_2})N$, wherein $x_2$ and $y_2$ are numbers meeting $x_2 = 0.5$-$0.9$, and $y_2 = 0.5$-$0.1$ by atomic ratio; the high-Al TiAlN being surrounded by the network-like, high-Ti TiAlN.

The hard-coated tool of the present invention comprises a hard titanium aluminum nitride coating formed on a substrate; the hard titanium aluminum nitride coating having a columnar crystal structure, and comprising high-Al TiAlN having an fcc structure, which has a composition represented by $(Ti_{x_1}, Al_{y_1})N$, wherein $x_1$ and $y_1$ are numbers meeting $x_1 = 0.005$-$0.1$, and $y_1 = 0.995$-$0.9$ by atomic ratio, and network-like, high-Ti TiAlN having an fcc structure, which has a composition represented by $(Ti_{x_2}, Al_{y_2})N$, wherein $x_2$ and $y_2$ are numbers meeting $x_2 = 0.5$-$0.9$, and $y_2 = 0.5$-$0.1$ by atomic ratio; the high-Al TiAlN being surrounded by the network-like, high-Ti TiAlN.

The hard-coated tool of the present invention preferably has a columnar-crystal titanium carbonitride coating as an underlayer for the hard titanium aluminum nitride coating. With such structure, the hard coating had improved wear resistance, providing a tool with longer life.

In the above hard titanium aluminum nitride coating, the high-Al TiAlN preferably has an average longitudinal cross section diameter of 2-50 nm and an average transverse cross section diameter of 10-300 nm. The columnar crystal preferably has an average lateral cross section diameter of 0.1-1.2 μm.

The method of the present invention for producing a hard titanium aluminum nitride coating by chemical vapor deposition comprises (1) using a mixture gas A comprising a $TiCl_4$ gas, an $AlCl_3$ gas, an $N_2$ gas, and an $H_2$ gas, and a mixture gas B comprising an $NH_3$ gas, an $N_2$ gas, and an $H_2$ gas as starting material gases;

(2) rotating first and second nozzles arranged with different distances from a rotation axis; and (3) ejecting the mixture gas A and the mixture gas B separately from the first and second nozzles.

The method of the present invention for producing a hard-coated tool having a hard titanium aluminum nitride coating by chemical vapor deposition, comprises (1) using a mixture gas A comprising a $TiCl_4$ gas, an $AlCl_3$ gas, an $N_2$ gas, and an $H_2$ gas, and a mixture gas B comprising an $NH_3$ gas, an $N_2$ gas, and an $H_2$ gas as starting material gases;
(2) rotating first and second nozzles arranged with different distances from a rotation axis;
(3) disposing a tool substrate around the first and second nozzles; and
(4) ejecting the mixture gas A and the mixture gas B separately from the first and second nozzles.

It is preferable that with the total amount of the mixture gases A and B as 100% by volume, the composition of the mixture gas A comprises 0.02-0.31% by volume of a $TiCl_4$ gas, 0.15-0.8% by volume of an $AlCl_3$ gas, and 3-40% by volume of an $N_2$ gas, the balance being an $H_2$ gas, and the composition of the mixture gas B comprises 0.4-1.9% by volume of an $NH_3$ gas, and 2-26% by volume of an $N_2$ gas, the balance being an $H_2$ gas; and that a volume ratio $H_2(A)/H_2(B)$ of the $H_2$ gas in the mixture gas A to the $H_2$ gas in the mixture gas B is 1-5.

With the distance $H_1$ from an opening of the first nozzle to the rotation axis longer than the distance $H_2$ from an opening of the second nozzle to the rotation axis, the mixture gas A may be ejected from the first nozzle, and the mixture gas B may be ejected from the second nozzle, or the mixture gas B may be ejected from the first nozzle, and the mixture gas A may be ejected from the second nozzle.

A ratio $H_1/H_2$ of the distance $H_1$ from an opening of the first nozzle to the rotation axis to the distance $H_2$ from an opening of the second nozzle to the rotation axis is preferably in a range of 1.5-3.

In the production method of the present invention, the reaction pressure is preferably 3-6 kPa, and the reaction temperature is preferably 750-830° C.

Effects of the Invention

Because the hard titanium aluminum nitride coating of the present invention has a columnar crystal structure, and comprises high-Al TiAlN having an fcc structure and network-like, high-Ti TiAlN having an fcc structure, with a microstructure in which the high-Al TiAlN is surrounded by the network-like, high-Ti TiAlN, a cutting tool having such hard titanium aluminum nitride coating suffers suppressed phase transformation of the fcc structure to an hcp structure even when its cutting edge is subjected to high temperatures during a cutting operation, thereby exhibiting remarkably high wear resistance and oxidation resistance.

DESCRIPTION OF THE PREFERRED EMBODIMENTS

[1] Hard-Coated Tool

Figure 1:
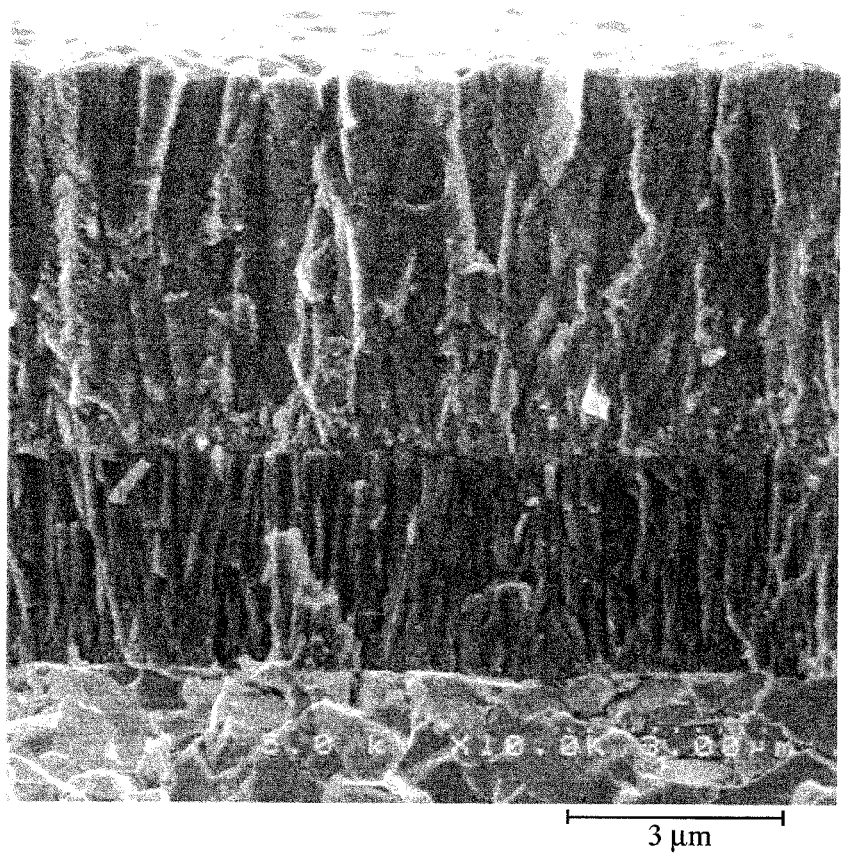
FIG. 1 is a scanning electron photomicrograph (SEM photograph, magnification: 10,000 times) showing a cross section of the hard-coated tool of Example 1.

The hard-coated tool of the present invention has a hard titanium aluminum nitride coating having a columnar crystal structure, which is formed on a tool substrate by chemical vapor deposition, the hard titanium aluminum nitride coating having a structure comprising high-Al TiAlN having an fcc structure, which has a composition represented by $(Ti_{x_1}, Al_{y_1})N$, wherein $x_1$ and $y_1$ are numbers meeting $x_1$=0.005-0.1, and $y_1$=0.995-0.9 by atomic ratio, and network-like, high-Ti TiAlN having an fcc structure, which has a composition represented by $(Ti_{x_2}, Al_{y_2})N$, wherein $x_2$ and $y_2$ are numbers meeting $x_2$=0.5-0.9, and $y_2$=0.5-0.1 by atomic ratio; the high-Al TiAlN being surrounded by the network-like, high-Ti TiAlN.

(A) Substrate

The substrate should be a material having high heat resistance, to which chemical vapor deposition can be applied, for example, WC-based cemented carbide, cermet, high-speed steel, tool steel, ceramics such as cubic-boron-nitride-based sintered boron nitride (cBN) and sialon, etc. From the aspect of strength, hardness, wear resistance, toughness and thermal stability, WC-based cemented carbide, cermet and ceramics are preferable. In the case of WC-based cemented carbide, for example, the hard titanium aluminum nitride coating of the present invention may be formed on its as-sintered surfaces, but preferably on its worked surfaces (ground surface, cutting edge surface, etc.) to increase dimension precision.

(B) Hard Titanium Aluminum Nitride Coating (1) Composition

The hard titanium aluminum nitride coating of the present invention formed by chemical vapor deposition has a columnar crystal structure, and comprises Ti, Al and N as indispensable components. The composition of indispensable components in the hard titanium aluminum nitride coating of the present invention preferably comprises 4-22 atomic % of Ti, 48-23 atomic % of Al, and 48-55 atomic % of N, with the total amount of Ti, Al and N as 100 atomic %. Outside the above composition range, the desired microstructure cannot be obtained. The composition of indispensable components more preferably comprises 8-18 atomic % of Ti, 42-29 atomic % of Al, and 50-53 atomic % of N. 30 atomic % or less of N may be substituted by C or B. Though the hard titanium aluminum nitride coating of the present invention may contain Cl as an inevitable impurity, the Cl content is preferably 1.5 atomic % or less, more preferably 0.8 atomic % or less. The composition of the hard titanium aluminum nitride coating can be measured by EPMA.

(a) Composition of High-Al TiAlN

The high-Al TiAlN has a composition represented by the general formula of $(Ti_{x_1}, Al_{y_1})N$, wherein $x_1$ and $y_1$ are numbers meeting $x_1=0.005$-$0.1$, and $y_1=0.995$-$0.9$ by atomic ratio. The percentage $x_1$ of Ti of less than 0.005 leading to too much Al causes the precipitation of an hcp structure, resulting in low hardness, and poor wear resistance at high temperatures. When $x_1$ is more than 0.1, the hard titanium aluminum nitride coating has a fine granular crystal structure, having reduced oxidation resistance. For higher performance, the atomic ratio of $(Ti_{x_1}, Al_{y_1})$ to N is preferably 0.3/0.7 to 0.7/0.3, more preferably 0.4/0.6 to 0.6/0.4.

(b) Composition of High-Ti TiAlN

The high-Ti TiAlN has a composition represented by the general formula of $(Ti_{x_2}, Al_{y_2})N$, wherein $x_2$ and $y_2$ are numbers meeting $x_2=0.5$-$0.9$, and $y_2=0.5$-$0.1$ by atomic ratio. The percentage $x_2$ of Ti of less than 0.5 leading to too much Al causes the precipitation of an hcp structure, resulting in low hardness and wear resistance. The $x_2$ of more than 0.9 leads to too little Al, resulting in drastically reduced oxidation resistance. For higher performance, the atomic ratio of $(Ti_{x_2}, Al_{y_2})$ to N is preferably 0.3/0.7 to 0.7/0.3, more preferably 0.4/0.6 to 0.6/0.4.

The compositions of high-Al TiAlN and high-Ti TiAlN can be determined by the measurement results of EDS described later.

(2) High-Al TiAlN and High-Ti TiAlN (a) Structure

Figure 3:
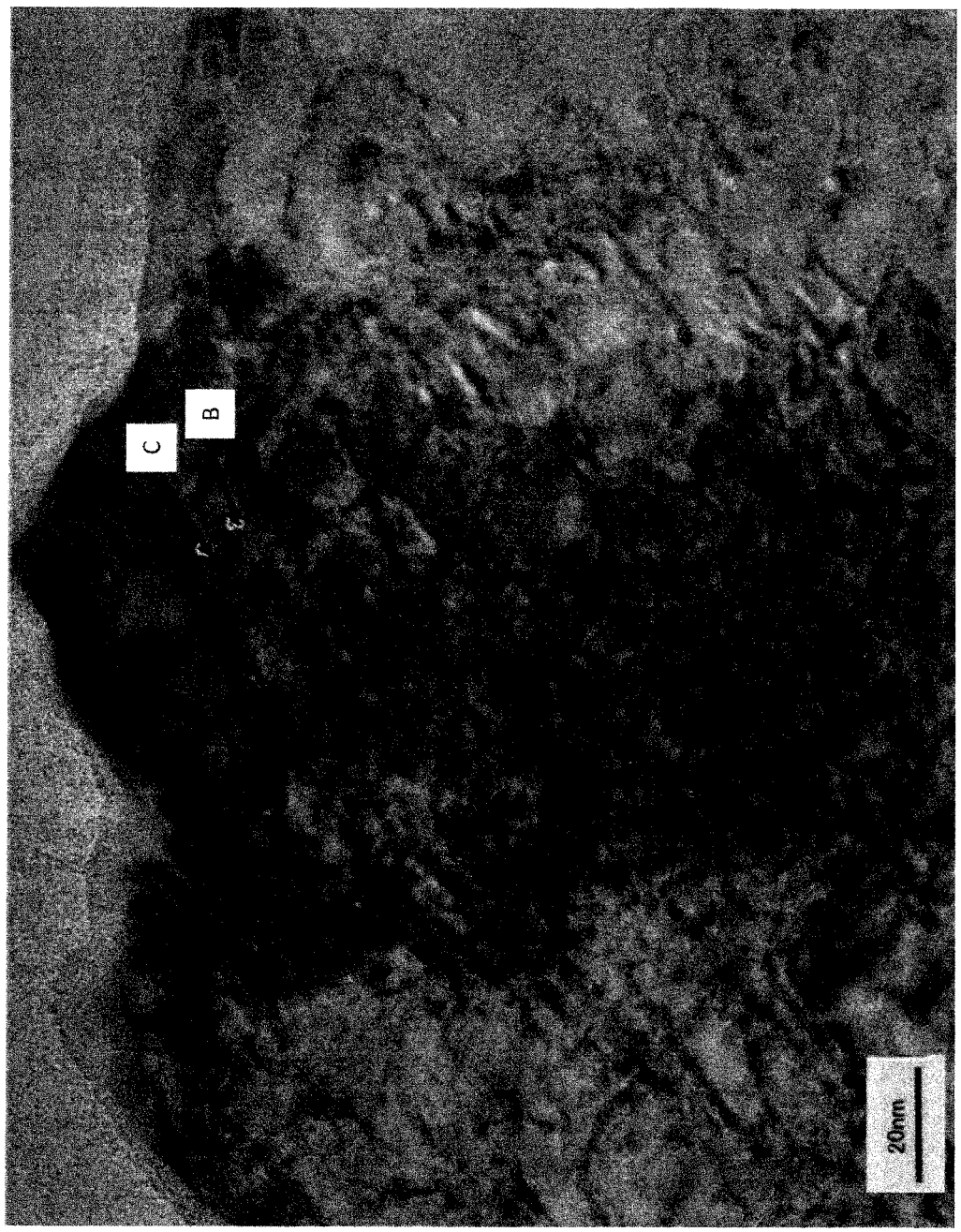
FIG. 3 is a TEM photograph (magnification: 200,000 times) enlargedly showing a portion A in FIG. 2.

As is clear from FIG. 3, the high-Al TiAlN (pale gray portion) having an fcc structure is surrounded by the network-like, high-Ti TiAlN (dark gray or black portion) having an fcc structure. Though portions having small concentration differences between high-Al TiAlN and high-Ti TiAlN are partially observed in FIG. 3, the effects of the present invention can be obtained as long as at least 50% of high-Al TiAlN is in contact with surrounding high-Ti TiAlN. Accordingly, "high-Al TiAlN surrounded by network-like, high-Ti TiAlN" means that at least 50% of the high-Al TiAlN is in contact with the surrounding network-like, high-Ti TiAlN. At least 60% of the high-Al TiAlN is preferably in contact with the surrounding network-like, high-Ti TiAlN. The "network-like" means that high-Ti TiAlN is distributed in a network form in a photomicrograph.

Though not necessarily clear, a reason why the hard titanium aluminum nitride coating of the present invention has higher performance than those of conventional hard titanium aluminum nitride coatings is considered as follows: Hard titanium aluminum nitride coatings formed by conventional chemical vapor deposition methods have structures in which TiAlN having different Al contents or TiN and AlN are alternately laminated. Because each layer in the laminate has fine granular crystal grains, there are a high percentage of crystal grain boundaries. When cutting is conducted by a tool having such hard titanium aluminum nitride coating, crystal grain boundaries act as paths for oxygen intrusion at cutting edges of the tool at elevated temperatures, so that oxidation is accelerated to drastically reduce wear resistance and oxidation resistance at high temperatures. Also, the fcc structure of high-Al TiAlN layers in the laminate is transformed to an hcp structure at high temperatures, causing interlayer delamination and thus resulting in a shorter life.

On the other hand, in the hard titanium aluminum nitride coating of the present invention, high-Al TiAlN is surrounded by network-like, high-Ti TiAlN. Because the high-Al TiAlN surrounded by the network-like, high-Ti TiAlN acts as starting portions of coating growth, titanium aluminum nitride crystal grains grow predominantly in one direction, resulting in columnar crystals. Accordingly, even when the high-Al TiAlN having an fcc structure shrinks by transformation to an hcp structure at a temperature elevated by cutting, the breakage of the coating is suppressed by the surrounding network-like, high-Ti TiAlN having an fcc structure. Such characteristic microstructure is not owned by conventional hard titanium aluminum nitride coatings. Thus, the hard titanium aluminum nitride coating of the present invention has much higher high-temperature hardness than those of conventional hard titanium aluminum nitride coatings, resulting in excellent wear resistance. Also, because the hard titanium aluminum nitride coating of the present invention has a large Al content, and a columnar crystal structure having fewer crystal grain boundaries than a granular crystal structure, it is less oxidized (having excellent oxidation resistance). The microstructure having high-Al TiAlN surrounded by network-like, high-Ti TiAlN can be identified by the measurement results of nanobeam diffraction (see FIGS. 6 and 7).

(b) Average Transverse and Longitudinal Cross Section Diameters of High-Al TiAlN The "average transverse cross section diameter" is an average of the maximum diameters of high-Al TiAlN portions in columnar crystal grains of the hard titanium aluminum nitride coating, in a TEM photograph of a cross section perpendicular to a substrate surface. The "average longitudinal cross section diameter" is an average of the maximum lengths of the high-Al TiAlN portions in directions perpendicular to the maximum diameters, in a TEM photograph of a cross section perpendicular to the substrate surface. Specifically, the "average transverse cross section diameter" of high-Al TiAlN is determined by arbitrarily selecting five high-Al TiAlN portions surrounded by network-like, high-Ti TiAlN in the TEM photograph (magnification: 200,000 times) of FIG. 3, measuring the maximum diameter in each selected portion, and arithmetically averaging five measured values. The "average longitudinal cross section diameter" of high-Al TiAlN is determined by measuring the maximum lengths of five selected portions in directions perpendicular to the maximum diameters in the TEM photograph of FIG. 3, and arithmetically averaging five measured values.

The high-Al TiAlN generally has a flat shape (see FIG. 4), with a larger average transverse cross section diameter than an average longitudinal cross section diameter. Specifically, the average longitudinal cross section diameter of high-Al TiAlN is preferably 2-50 nm, more preferably 6-45 nm. When the average longitudinal cross section diameter is less than 2 nm, the hard titanium aluminum nitride coating has too small an Al content, resulting in poor oxidation resistance. On the other hand, when the average longitudinal cross section diameter exceeds 50 nm, the hard titanium aluminum nitride coating has too large an Al content, resulting in an increased percentage of an hcp structure, and thus lower hardness. The average transverse cross section diameter of high-Al TiAlN is preferably 10-300 nm, more preferably 22-120 nm. When the average transverse cross section diameter is less than 10 nm, the hard titanium aluminum nitride coating has low oxidation resistance. On the other hand, when the average transverse cross section diameter exceeds 300 nm, the hard titanium aluminum nitride coating has a finer granular crystal structure, suffering the phase transformation of an fcc structure to an hcp structure, and thus poor wear resistance at high temperatures.

(3) Average Lateral Cross Section Diameter of Columnar Crystals in Hard Titanium Aluminum Nitride Coating The hard titanium aluminum nitride coating of the present invention has a columnar crystal structure. The "average lateral cross section diameter" of columnar crystals is an average diameter of cross sections of columnar crystal grains in a plane perpendicular to the substrate surface. To have high hardness and excellent wear resistance, the average lateral cross section diameter of columnar crystals is preferably 0.1-1.2 μm, more preferably 0.2-1.0 μm. At the average lateral cross section diameter of less than 0.1 μm, a percentage of crystal grain boundaries to titanium aluminum nitride crystal grains is high, resulting in drastically reduced oxidation resistance at high temperatures. On the other hand, when the average lateral cross section diameter is more than 1.2 μm, cracking occurs in crystal grains, resulting in the breakage of the coating. Specifically, the average lateral cross section diameter is determined by measuring the lateral cross section diameters of 10 arbitrary columnar crystal grains in a thickness-direction immediate portion of the hard titanium aluminum nitride coating on the SEM photograph of FIG. 1, and arithmetically averaging the measured values.

(4) Thickness of Hard Titanium Aluminum Nitride Coating

To prevent peeling from the substrate while exhibiting excellent wear resistance and oxidation resistance, the thickness of the hard titanium aluminum nitride coating of the present invention is preferably 1-15 μm, more preferably 2-12 μm. The thickness of less than 1 μm does not provide sufficient coating effects, and the thickness of more than 15 μm likely causes cracking in the coating because of too much thickness. The thickness of the hard titanium aluminum nitride coating can be properly controlled by coating time. Because the hard coating and each layer constituting it are not completely flat, what is simply called "thickness" means an "average thickness."

(5) Hardness

The hardness of the hard titanium aluminum nitride coating of the present invention measured by a nanoindentation method is preferably 33 GPa or more. When the hardness is less than 33 GPa, the hard titanium aluminum nitride coating has insufficient wear resistance. By industrial production, the hardness of 35-42 GPa can be achieved.

(C) Underlayer

Though not particularly restrictive, a Ti(CN) coating, a TiN coating or a TiZr(CN) coating is preferably formed by chemical vapor deposition as an underlayer for the hard titanium aluminum nitride coating of the present invention. A Ti(CN) coating has poor heat resistance at high temperatures despite excellent wear resistance, but its disadvantage of heat resistance can be overcome by forming the hard titanium aluminum nitride coating of the present invention thereon.

The temperature of forming a Ti(CN) coating by chemical vapor deposition is 750-950° C., substantially equal to the preferred coating temperature (750-830° C.) of the hard titanium aluminum nitride coating of the present invention, resulting in high industrial productivity. In the hard-coated tool of the present invention, an adhesion-increasing intermediate layer may be formed between the hard titanium aluminum nitride coating and the Ti(CN) coating. The intermediate layer is preferably a TiN coating or a TiAl(CN) coating.

(d) Upper Layer

Though not particularly restrictive, a single- or multi-layer hard coating indispensably comprising at least one element selected from the group consisting of Ti, Al, Cr, B and Zr, and at least one element selected from the group consisting of C, N and O may be formed by chemical vapor deposition, as an upper layer on the hard titanium aluminum nitride coating of the present invention. The upper layer is a single- or multi-layer coating of, for example, TiC, CrC, SiC, VC, ZrC, TiN, AlN, CrN, $Si_3N_4$, VN, ZrN, Ti(CN), (TiSi) N, (TiB)N, TiZrN, TiAl(CN), TiSi(CN), TiCr(CN), TiZr(CN), Ti(CNO), TiAl(CNO), Ti(CO), $TiB_2$, etc.

[2] Chemical Vapor Deposition Apparatus

Figure 11:
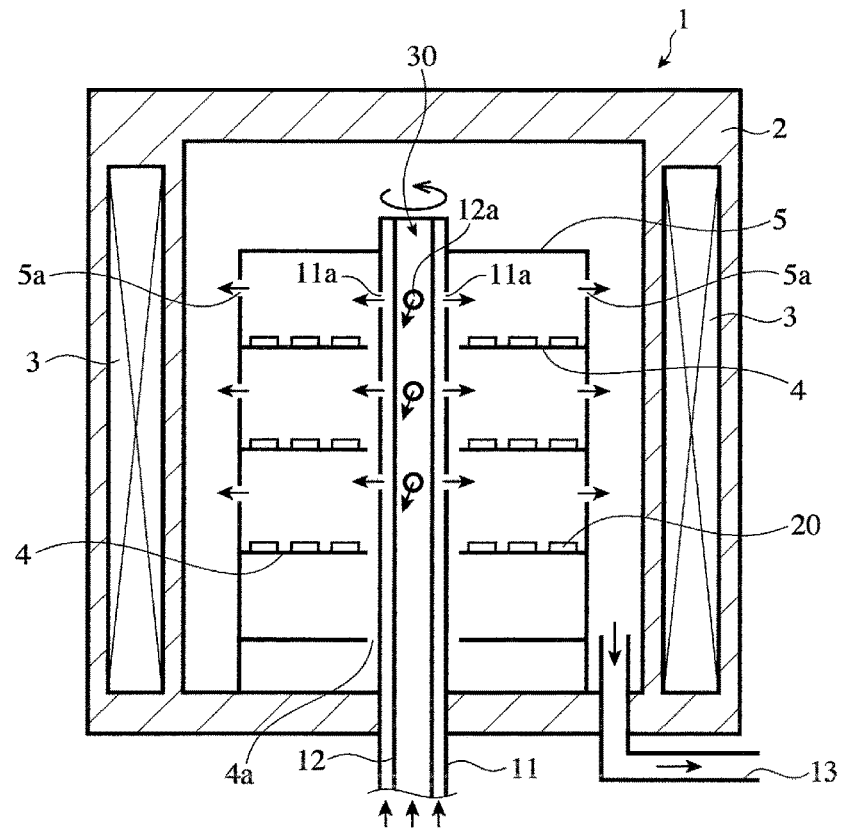
FIG. 11 is a schematic view showing an example of chemical vapor deposition apparatuses (CVD furnaces) for forming the hard titanium aluminum nitride coating of the present invention.

The hard titanium aluminum nitride coating of the present invention can be formed by chemical vapor deposition, using a thermal or plasma-enhanced chemical vapor deposition apparatus (CVD furnace). As shown in FIG. 11, the CVD furnace 1 comprises a chamber 2, a heater 3 arranged inside a wall of the chamber 2, pluralities of shelves (jigs) 4, 4 rotating in the chamber 2, a reaction vessel 5 covering the shelves 4, 4 and having pluralities of vents 5a, first and second pipes 11, 12 vertically penetrating center openings 4a of the shelves 4, 4, and pluralities of nozzles 11a, 12a, 12b attached to each pipe 11, 12. The shelves 4, 4, on which large numbers of insert substrates 20 are set, are rotated in the chamber 2. The first and second pipes 11, 12 constitute a pipe assembly with both end portions integrally fixed by holding members (not shown), and penetrate a bottom of the chamber 2 such that they are integrally rotated. The first and second pipes 11, 12 are rotatably connected to outside pipes (not shown). A bottom of the chamber 2 is provided with a pipe 13 for discharging a carrier gas and unreacted gases.

[3] Production Method

The production method of the hard titanium aluminum nitride coating of the present invention will be explained in detail below, taking a case of using a thermal vapor deposition method for example, but it should be noted that the present invention is not restricted thereto, and that other chemical vapor deposition methods can be used.

(A) Formation of Underlayer (Titanium Carbonitride Coating)

An $H_2$ gas, an $N_2$ gas, and/or an Ar gas are introduced into a CVD furnace in which substrates are set, and after heated to the coating temperature, a starting material gas comprising a $TiCl_4$ gas, an $N_2$ gas, a $CH_3CN$ gas (or a $CH_3CN$ gas and a $C_2H_6$ gas), and an $H_2$ gas are introduced into the CVD furnace to form a titanium carbonitride underlayer.

(1) Starting Material Gas for l-Ti(CN) Coating

The composition of a starting material gas for forming an l-Ti(CN) coating having a columnar crystal structure as an example of the underlayers preferably comprises 0.8-3% by volume of a $TiCl_4$ gas, 10-30% by volume of an $N_2$ gas, and 0.1-1.2% by volume of a $CH_3CN$ gas, the balance being an $H_2$ gas, their total amount being 100% by volume. With the amounts of a $TiCl_4$ gas, an $N_2$ gas, a $CH_3CN$ gas and an $H_2$ gas outside the above ranges, the resultant titanium carbonitride coating has too high a carbon concentration, or contains too large columnar crystal grains, resulting in low adhesion to an upper hard titanium aluminum nitride layer.

(B) Formation of Hard Titanium Aluminum Nitride Coating (1) Starting Material Gases for Hard Titanium Aluminum Nitride Coating As starting material gases for forming the hard titanium aluminum nitride coating, a mixture gas A comprising a $TiCl_4$ gas, an $AlCl_3$ gas, an $N_2$ gas, and an $H_2$ gas, and a mixture gas B comprising an $NH_3$ gas, an $N_2$ gas, and an $H_2$ gas are used. It is preferable that with the total amount of a $TiCl_4$ gas, an $AlCl_3$ gas, an $NH_3$ gas, an $N_2$ gas, and an $H_2$ gas as 100% by volume, the composition of the mixture gas A comprises 0.02-0.31% by volume of a $TiCl_4$ gas, 0.15-0.8% by volume of an $AlCl_3$ gas, and 3-40% by volume of an $N_2$ gas, the balance being an $H_2$ gas, and the composition of the mixture gas B comprises 0.4-1.9% by volume of an $NH_3$ gas, and 2-26% by volume of an $N_2$ gas, the balance being an $H_2$ gas, a volume ratio $H_2(A)/H_2(B)$ of the $H_2$ gas in the mixture gas A to the $H_2$ gas in the mixture gas B being 1-5. At any volume ratio $H_2(A)/H_2(B)$ of less than 1 or more than 5, the reaction speed of the starting material gas is uneven, providing hard titanium aluminum nitride coatings formed on substrates set in the CVD furnace with poor thickness distributions. In the mixture gases A, B, part of the $H_2$ gas as a carrier gas may be substituted by an Ar gas. More preferably, the composition of the mixture gas A comprises 0.02-0.31% by volume of a $TiCl_4$ gas, 0.15-0.8% by volume of an $AlCl_3$ gas, and 4.9-21.8% by volume of an $N_2$ gas, the balance being an $H_2$ gas, and the composition of the mixture gas B comprises 0.7-1.9% by volume of an $NH_3$ gas, and 3-16.5% by volume of an $N_2$ gas, the balance being an $H_2$ gas. Further preferably, the composition of the mixture gas A comprises 0.1-0.2% by volume of a $TiCl_4$ gas, 0.3-0.5% by volume of an $AlCl_3$ gas, and 4.9-21.8% by volume of an $N_2$ gas, the balance being an $H_2$ gas, and the composition of the mixture gas B comprises 0.8-1.3% by volume of an $NH_3$ gas, and 3-16.5% by volume of an $N_2$ gas, the balance being an $H_2$ gas. The volume ratio $H_2(A)/H_2(B)$ is more preferably 1.5-4.8.

(a) Mixture Gas A

When the $TiCl_4$ gas is less than 0.02% by volume, the amount of Al is too large in the mixture gas A, so that an hcp structure is precipitated, resulting in a hard titanium aluminum nitride coating having low hardness. On the other hand, when the $TiCl_4$ gas is more than 0.31% by volume, the resultant hard titanium aluminum nitride coating does not have the microstructure of the present invention.

When the $AlCl_3$ gas is less than 0.15% by volume, the hard titanium aluminum nitride coating contains too small an amount of Al, having low oxidation resistance. When the $AlCl_3$ gas is more than 0.8% by volume, the hard titanium aluminum nitride coating contains too large an amount of Al, having an hcp structure precipitated, and thus low wear resistance.

When the $N_2$ gas is either less than 3% by volume or more than 40% by volume, the reaction speed of starting material gases is uneven, so that hard titanium aluminum nitride coatings having a poor thickness distribution are formed on substrates set in a CVD furnace.

(b) Mixture Gas B

When the $NH_3$ gas is either less than 0.4% by volume or more than 1.9% by volume in the mixture gas B, the reaction speed is uneven, failing to obtain a microstructure peculiar to the present invention.

When the $N_2$ gas is either less than 2% by volume or more than 26% by volume, the reaction speed of starting material gases is uneven, so that hard titanium aluminum nitride coatings having a poor thickness distribution are formed on substrates set in a CVD furnace.

(2) Method of Introducing Starting Material Gases

To form a microstructure in which high-Al TiAlN having an fcc structure is surrounded by network-like, high-Ti TiAlN having an fcc structure, by mixing highly reactive mixture gases A and B to control their reaction speed, the mixture gases A and B should be introduced into a CVD furnace 1 without contact. For this purpose, for example, a CVD furnace 1 comprising a pipe assembly 30, in which three pipes 11, 11, 12 in total are fixed as shown in FIGS. 11 and 12(a)-12(c), is used.

The mixture gases A and B should be separately introduced into the CVD furnace 1, without hindering the flow of the mixture gases A, B ejected from each nozzle. To this end, as exemplified in FIGS. 12(a) to 12(c), with one of the first and second nozzles ejecting the mixture gases A, B arranged at a center, and the other arranged on a periphery, the mixture gases A and B should be separately ejected from the first and second nozzles.

To obtain the characteristic microstructure of the present invention, the nozzles 11a, 12a introducing the mixture gases A, B are preferably rotated at a speed of 2-4 rpm. The rotation directions of the first and second nozzles 11a, 12a are not restricted.

Figure 12A:
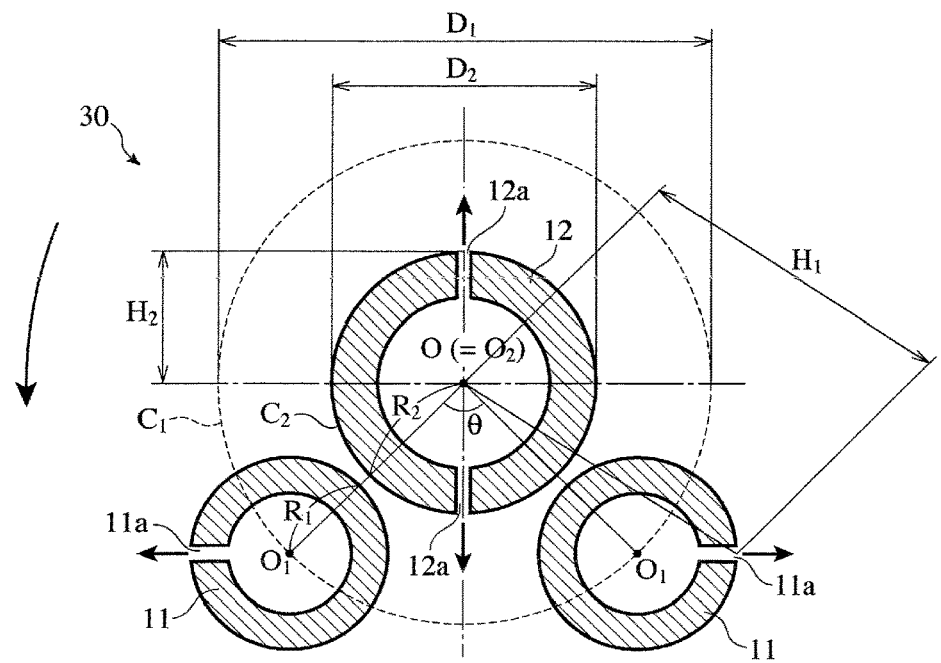
FIG. 12(a) is a transverse cross-sectional view showing an example of assemblies of the first and second pipes.
Figure 12B:
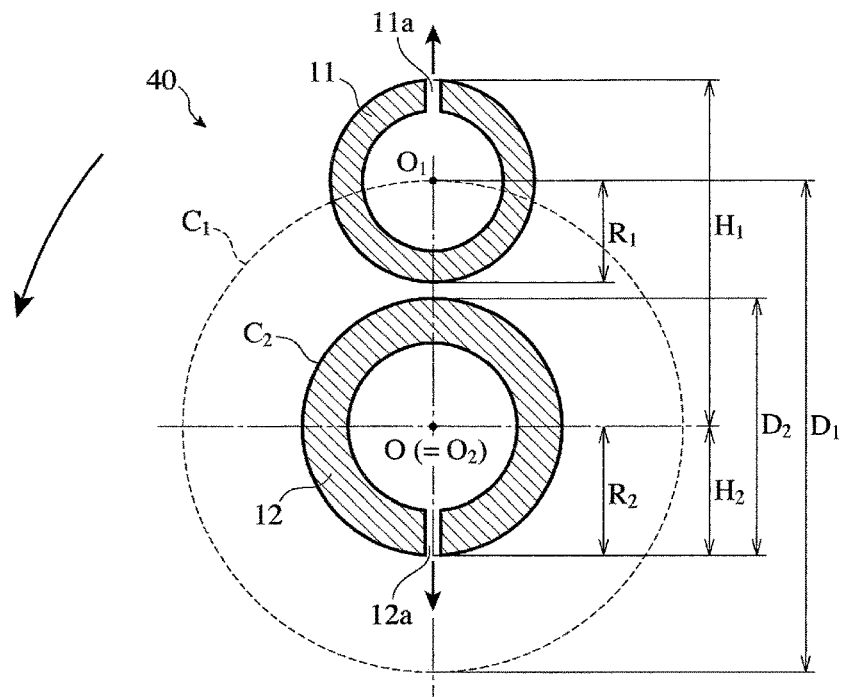
FIG. 12(b) is a transverse cross-sectional view showing another example of assemblies of the first and second pipes.
Figure 12C:
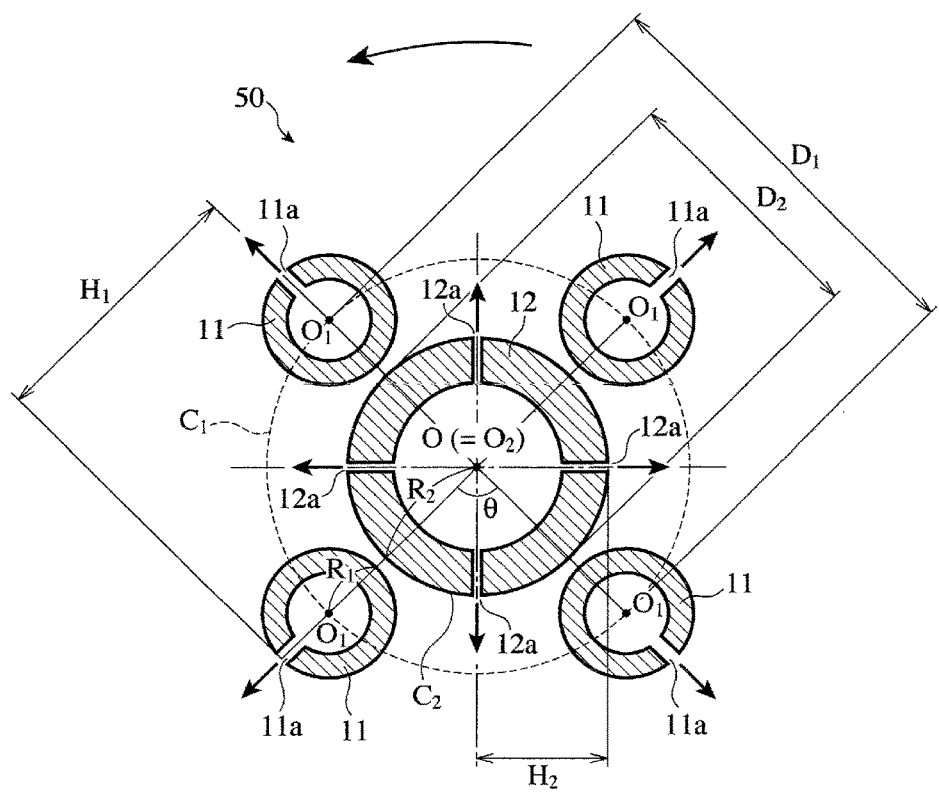
FIG. 12(c) is a transverse cross-sectional view showing a further example of assemblies of the first and second pipes.
Figure 13:
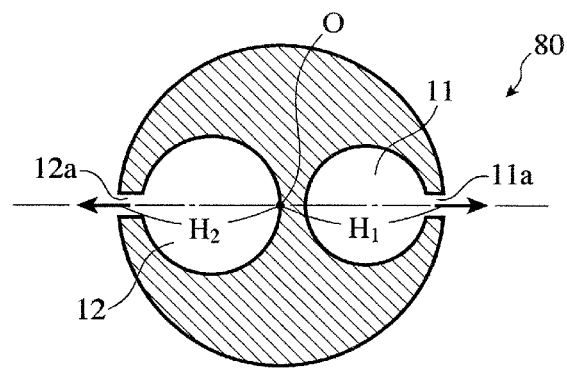
FIG. 13 is a transverse cross-sectional view showing an integral pipe assembly comprising nozzles for ejecting starting material gases in the same direction as in the apparatus described in JP 2014-129562 A.
Figure 14:
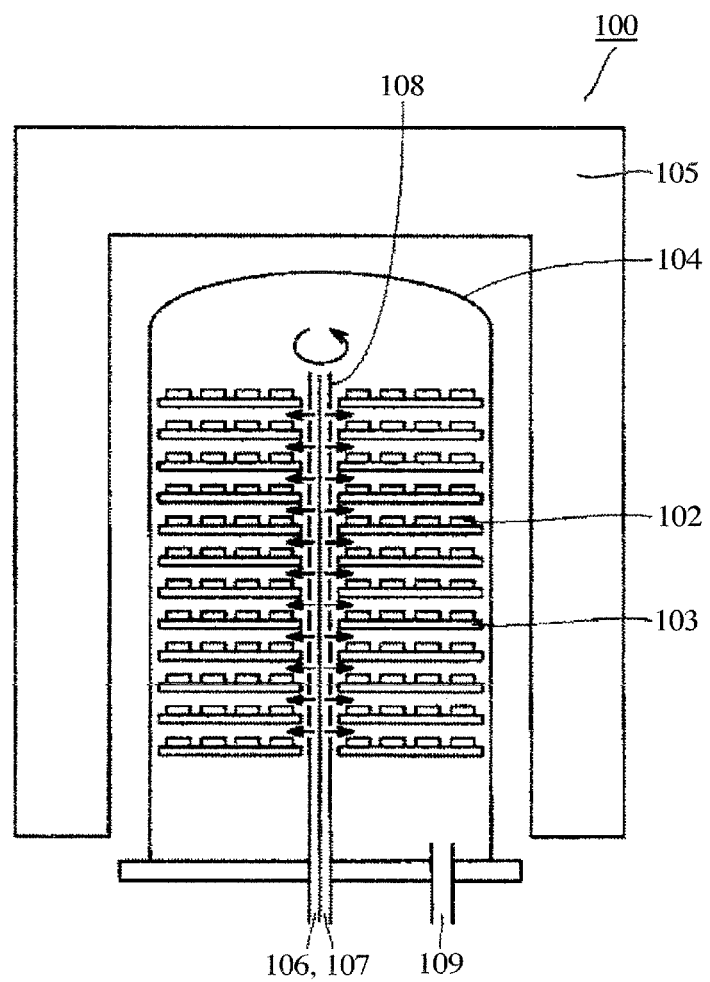
FIG. 14 is a schematic view showing the CVD apparatus described in JP 2014-129562 A.

FIGS. 12(a) to 12(c) show preferred examples of the arrangements of nozzles ejecting the mixture gases A, B. With respect to the rotation axis O of the pipe assembly 30, the first nozzles 11a are positioned on the periphery side, while the second nozzles 12a are positioned on the center side. To form the above characteristic microstructure, the distance from an opening of a nozzle ejecting the mixture gas B to a substrate is preferably smaller than the distance from an opening of a nozzle ejecting the mixture gas A to a substrate. A $TiCl_4$ gas and an $AlCl_3$ gas in the mixture gas A are so highly reactive with an $NH_3$ gas in the mixture gas B that they are rapidly reacted after introduced into the CVD furnace. A high reaction speed likely causes reaction before reaching the substrate. Accordingly, if nozzle openings ejecting the mixture gases A and B are positioned at equal distance from the rotation axis ($H_1=H_2$) as shown in FIG. 13, the reaction of the mixture gases A and B occurs remarkably until they reach the substrate, resulting in a hard titanium aluminum nitride coating having a fine granular crystal structure. Oppositely, the distance from an opening of a nozzle for the mixture gas A to a substrate may be smaller than the distance from an opening of a nozzle for the mixture gas B to a substrate.

To obtain the characteristic microstructure of the present invention, a ratio $H_1/H_2$ of the distance $H_1$ from an opening of a first nozzle 11a to the rotation axis O to the distance $H_2$ from an opening of a second nozzle 12a to the rotation axis O is preferably in a range of 1.5-3.

(a) First Pipe Assembly

FIG. 12(a) shows an example of first pipe assemblies 30 for introduced the mixture gases A and B into a CVD furnace 1 without contact. This pipe assembly 30 comprises two first pipes 11, 11, and one second pipe 12, both end portions of the first and second pipes 11, 11, 12 being integrally fixed by holding members (not shown).

The first pipe 11 has a radius $R_1$, and the second pipe 12 has a radius $R_2$. The center axis $O_1$ of the first pipe 11 is positioned on a circle $C_1$ having a first diameter $D_1$ around the rotation axis O. Accordingly, two first pipes 11, 11 are positioned at equal distance from the rotation axis O. A center angle θ of the center axes $O_1$, $O_1$ of the first pipes 11, 11 to the rotation axis O is preferably 90-180°. The center axis $O_2$ of the second pipe 12 is at the same position as that of the rotation axis O, and an outer periphery of the second pipe 12 is on a circle $C_2$ having a second diameter $D_2$ (=2$R_2$) around the rotation axis O.

The nozzles (first nozzles) 11a, 11a of the first pipes 11, 11 are directed outward in a just opposite direction (180° direction). Though each first pipe 11 has a vertical line of nozzles (first nozzles) 11a in the depicted example, it is not restrictive, but the first nozzles 11a may be aligned along plural lines. The second pipe 12 has two vertical lines of nozzles (second nozzles) 12a, 12a arranged in a diametrical direction (180° direction). Of course, the second nozzles 12a are not restricted to two lines, but may be in one line. Because the first diameter $D_1$ is larger than the second diameter $D_2$ [$D_1 \geq 2$ ($R_1+R_2$)], the first nozzles 11a, 11a are located outside, and the second nozzles 12a, 12a are located inside, when the pipe assembly 30 is rotated around the rotation axis O.

When the second pipe 12 has a line of second nozzles 12a, and the center angle θ of the center axes $O_1$, $O_1$ of the first pipes 11, 11 is less than 180°, the second nozzles 12a are directed preferably in a distant direction (opposite to the center angle θ) from the first nozzles 11a, 11a. In this case, the ejection direction of the first nozzles 11a is preferably perpendicular to the ejection direction of the second nozzles 12a.

It is preferable that when the center axes $O_1$, $O_1$ of the first pipes 11, 11 and the center axis $O_2$ of the second pipe 12 are on the same line, and when the second pipe 12 has two lines of second nozzles 12a, 12a, the first nozzles 11a, 11a are directed outward oppositely (180° direction), and the second nozzles 12a are directed oppositely and perpendicularly to the first nozzles 11a, 11a (at a center angle of 90°).

(b) Second Pipe Assembly

FIG. 12(b) shows an example of second pipe assemblies 40 for introducing the mixture gases A and B into a CVD furnace 1 without contact. This pipe assembly 40 comprises one first pipe 11 and one second pipe 12, both end portions of the first and second pipes 11, 12 being integrally fixed by holding members (not shown). The first pipe 11 has a line of nozzles (first nozzles) 11a, and the second pipe 12 has a vertical line of nozzles (second nozzles) 12a.

The center axis $O_2$ of the second pipe 12 is at the same position as that of the rotation axis O of the pipe assembly 40, with the first pipe 11 positioned near the second pipe 12. The first pipe 11 has a radius $R_1$, and the second pipe 12 has a radius $R_2$. The center axis $O_1$ of the first pipe 11 is positioned on a circle $C_1$ having a first diameter $D_1$ around the rotation axis O. The second pipe 12 has a center axis $O_2$ at the same position as that of the rotation axis O, and its periphery coincides a circle $C_2$ having a second diameter $D_2$ (=2$R_2$) around the rotation axis O. Because the first diameter $D_1$ is larger than the second diameter $D_2$ [$D_1 \geq 2$ ($R_1+R_2$)], the first nozzle 11a is located outside, while the second nozzle 12a is located inside, when the pipe assembly 40 is rotated around the rotation axis O.

Though the nozzles (first nozzles) 11a of the first pipe 11 and the second nozzles 12a of the second pipe 12 are directed oppositely (180° direction) in the depicted example, it is of course not restricted as long as a center angle of the first nozzle 11a and the second nozzle 12a is within 90-180°.

(c) Third Pipe Assembly

FIG. 12(c) shows an example of third pipe assemblies 50 for introducing the mixture gases A and B into a CVD furnace 1 without contact. This pipe assembly 50 comprises four first pipes 11, 11, 11, 11 and one second pipe 12, both end portions of the first and second pipes 11, 11, 11, 11, 12 being integrally fixed by holding members (not shown). Each first pipe 11 has a vertical line of nozzles (first nozzles) 11a, and the second pipe 12 has two pairs of vertical lines of nozzles (second nozzles) 12a, 12a, 12a, 12a arranged in perpendicular diametrical directions (180°). The nozzles (first nozzles) 11a, 11a, 11a, 11a of all first pipes 11, 11, 11, 11 are directed outward.

The first pipe 11 has a radius $R_1$, and the second pipe 12 has a radius $R_2$. The center axis $O_1$ of each first pipe 11 is positioned on a circle $C_1$ having a first diameter $D_1$ around the rotation axis O. Accordingly, four first pipes 11, 11, 11, 11 are located at equal distance from the rotation axis O. The center axis $O_2$ of the second pipe 12 is at the same position as that of the rotation axis O, with its periphery located on a circle $C_2$ having a second diameter $D_2$ (=2$R_2$) around the rotation axis O. Because the first diameter $D_1$ is larger than the second diameter $D_2$ [$D_1 \geq 2$ ($R_1+R_2$)], the first nozzles 11a, 11a, 11a, 11a are outside, while the second nozzles 12a, 12a, 12a, 12a are inside, when the pipe assembly 50 is rotated around the rotation axis O. Though a center angle θ of the center axes $O_1$, $O_1$ of the adjacent first pipes 11, 11 to the rotation axis O is 90° in the depicted example, it is not restricted but may be 60-120°.

(3) Coating-Forming Temperature

The temperature of forming the hard titanium aluminum nitride coating is preferably 750-830° C. When the coating-forming temperature is lower than 750° C., the resultant hard titanium aluminum nitride coating has too high a chlorine content, resulting in low hardness. On the other hand, when the coating-forming temperature exceeds 830° C., the reaction is too accelerated, forming a granular crystal structure, and thus resulting in poor oxidation resistance.

(3) Reaction Pressure

The reaction pressure of forming the hard titanium aluminum nitride coating is preferably 3-6 kPa. When the reaction pressure is less than 3 kPa, the above characteristic microstructure cannot be obtained. On the other hand, when the reaction pressure exceeds 6 kPa, the resultant hard titanium aluminum nitride coating has a granular crystal structure, and thus poor oxidation resistance.

(C) Formation of Upper Layers (Hard Coatings)

Though not particularly restrictive, upper layers may be formed on the hard titanium aluminum nitride coating by a known chemical vapor deposition method. The upper-layer-forming temperature may be 700-830° C. Starting material gases used for forming the upper layers are exemplified as follows:

1. TiC coating: a $TiCl_4$ gas, a $CH_4$ gas, and an $H_2$ gas.
2. CrC coating: a $CrCl_3$ gas, a $CH_4$ gas, and an $H_2$ gas.
3. SiC coating: a $SiCl_4$ gas, a $CH_4$ gas, and an $H_2$ gas.
4. VC coating: a $VCl$ gas, a $CH_4$ gas, and an $H_2$ gas.
5. ZrC coating: a $ZrCl_4$ gas, a $CH_4$ gas, and an $H_2$ gas.
6. TiN coating: a $TiCl_4$ gas, an $N_2$ gas, and an $H_2$ gas.
7. AN coating: an $AlCl_3$ gas, an $NH_3$ gas, and an $H_2$ gas.
8. CrN coating: a $CrCl_3$ gas, an $NH_3$ gas, and an $H_2$ gas.
9. $Si_3N_4$ coating: a $SiCl_4$ gas, an $NH_3$ gas, and an $H_2$ gas.
10. VN coating: a $VCl_3$ gas, an $NH_3$ gas, and an $H_2$ gas.
11. ZrN coating: a $ZrCl_4$ gas, an $N_2$ gas, and an $H_2$ gas.
12. Ti(CN) coating: a $TiCl_4$ gas, a $CH_4$ gas, an $N_2$ gas, and an $H_2$ gas, or a $TiCl_4$ gas, a $CH_3CN$ gas, an $N_2$ gas, and an $H_2$ gas.
13. (TiSi)N coating: a $TiCl_4$ gas, a $SiCl_4$ gas, an $N_2$ gas, and an $NH_3$ gas.
14. (TiB)N coating: a $TiCl_4$ gas, an $N_2$ gas, and a $BCl_3$ gas.
15. TiZr(CN) coating: a $TiCl_4$ gas, a $ZrCl_4$ gas, an $N_2$ gas, a $CH_4$ gas, and an $H_2$ gas, or a $TiCl_4$ gas, a $ZrCl_4$ gas, an $N_2$ gas, a $CH_3CN$ gas, and an $H_2$ gas.

16. TiAl(CN) coating: a TiCl$_4$ gas, an AlCl$_3$ gas, an N$_2$ gas, a CH$_4$ gas, an NH$_3$ gas, and an H$_2$ gas, or a TiCl$_4$ gas, an AlCl$_3$ gas, an N$_2$ gas, a CH$_3$CN gas, and an H$_2$ gas.

17. TiSi(CN) coating: a TiCl$_4$ gas, a SiCl$_4$ gas, an N$_2$ gas, a CH$_4$ gas, an NH$_3$ gas, and an H$_2$ gas, or a TiCl$_4$ gas, a SiCl$_4$ gas, an N$_2$ gas, a CH$_3$CN gas, and an H$_2$ gas.

18. TiCr(CN) coating: a TiCl$_4$ gas, a CrCl$_3$ gas, an N$_2$ gas, a CH$_4$ gas, an NH$_3$ gas, and an H$_2$ gas, or a TiCl$_4$ gas, a CrCl$_3$ gas, an N$_2$ gas, a CH$_3$CN gas, and an H$_2$ gas.

19. TiV(CN) coating: a TiCl$_4$ gas, a VCl$_3$ gas, an N$_2$ gas, a CH$_4$ gas, an NH$_3$ gas, and an H$_2$ gas, or a TiCl$_4$ gas, a VCl$_3$ gas, an N$_2$ gas, a CH$_3$CN gas, and an H$_2$ gas.

20. TiZr(CN) coating: a TiCl$_4$ gas, a ZrCl$_4$ gas, an N$_2$ gas, a CH$_4$ gas, an NH$_3$ gas, and an H$_2$ gas, or a TiCl$_4$ gas, a ZrCl$_4$ gas, an N$_2$ gas, a CH$_3$CN gas, and an H$_2$ gas.

21. Ti(CNO) coating: a TiCl$_4$ gas, an N$_2$ gas, a CH$_4$ gas, a CO gas, and an H$_2$ gas, or a TiCl$_4$ gas, an N$_2$ gas, a CH$_3$CN gas, a CO gas, and an H$_2$ gas.

22. TiAl(CNO) coating: a TiCl$_4$ gas, an AlCl$_3$ gas, an N$_2$ gas, a CH$_4$ gas, a CO gas, and an H$_2$ gas, or a TiCl$_4$ gas, an AlCl$_3$ gas, an N$_2$ gas, a CH$_3$CN gas, a CO gas, and an H$_2$ gas.

23. Ti(CO) coating: a TiCl$_4$ gas, an N$_2$ gas, a CH$_4$ gas, a CO gas, a CO$_2$ gas, and an H$_2$ gas.

24. TiB$_2$ coating: a TiCl$_4$ gas, a BCl$_3$ gas, and an H$_2$ gas.

(D) Treatment of Cutting Edge after Forming Hard Coating

The hard titanium aluminum nitride coating formed on the substrate is smoothed by brushing, buffing, blasting, etc., to achieve a surface state having excellent chipping resistance. Particularly when a hard-coated cutting edge is treated by wet or dry blasting using ceramic powder of alumina, zirconia, silica, etc., the hard coating is provided with smoothed surface and reduced residual tensile stress, thereby getting improved chipping resistance.

The present invention will be explained in further detail by Examples below, of course without intention of restricting the present invention thereto. In Examples and Comparative Examples below, the flow rate (L/minute) is expressed by L per every minute at 1 atom and 25° C., and the thickness is expressed by an average value.

Example 1

(1) Formation of Hard Coating

Figure 9A:
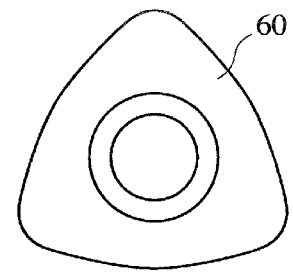
FIG. 9(a) is a schematic plan view showing a milling insert.
Figure 9B:
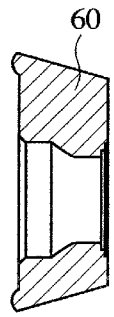
FIG. 9(b) is schematic side view showing a milling insert.

Milling insert substrates (WDNW140520-B) of WC-based cemented carbide comprising 11.5% by mass of Co, 2.0% by mass of TaC, and 0.7% by mass of CrC, the balance being WC and inevitable impurities, which are schematically shown in FIGS. 9(a) and 9(b), and property-evaluating insert substrates (SNMN120408) of WC-based cemented carbide comprising 7% by mass of Co, 0.6% by mass of CrC, 2.2% by mass of ZrC, 3.3% by mass of TaC, and 0.2% by mass of NbC, the balance being WC and inevitable impurities were set in the CVD furnace 1 shown in FIG. 11, and the temperature in the CVD furnace 1 was elevated to 850° C. while flowing an H$_2$ gas. Thereafter, a starting material gas comprising 83.1% by volume of an H$_2$ gas, 15.0% by volume of an N$_2$ gas, 1.5% by volume of a TiCl$_4$ gas, and 0.4% by volume of a CH$_3$CN gas was flown at a flow rate of 6700 m L/minute into the CVD furnace 1, at 850° C. and 8 kPa. Thus, a 3-µm-thick titanium carbonitride coating was formed on each substrate by chemical vapor deposition.

Introduced into the CVD furnace 1 using the pipe assembly 30 shown in FIG. 12(a), which was rotated at a speed of 2 rpm, after the temperature and the pressure in the CVD furnace 1 were lowered to 800° C. and 4 kPa, respectively, while flowing an H$_2$ gas, were (a) a mixture gas A comprising 0.15% by volume of a TiCl$_4$ gas, 0.45% by volume of an AlCl$_3$ gas, 7.50% by volume of an N$_2$ gas, and 52.51% by volume of an H$_2$ gas, through the first nozzles 11a, 11a of the first pipes 11, 11, and (b) a mixture gas B comprising 30.76% by volume of an H$_2$ gas, 7.50% by volume of an N$_2$ gas, and 1.13% by volume of an NH$_3$ gas, through the second nozzles 12a of the second pipe 12. The total flow rate of the mixture gases A and B was 66.65 L/minute. Thus, a 5-µm-thick hard titanium aluminum nitride coating having a composition represented by Ti$_{0.15}$Al$_{0.33}$N$_{0.52}$ (atomic ratio) was formed on each titanium carbonitride layer by chemical vapor deposition, to produce the hard-coated tools of the present invention (milling inserts).

(2) Measurement of Thickness

The thicknesses of the titanium carbonitride coating and the hard titanium aluminum nitride coating of each hard-coated tool were measured by the following procedure. Each coating surface was lapped slantingly at an angle of 5° to obtain a lapped surface, and the lapped surface exposing the thickness-direction cross sections of the hard coatings was observed by an optical microscope of 1,000 times at five arbitrary points to measure the thickness of each layer, and the measured thicknesses were arithmetically averaged. The results are shown in Table 2.

(3) Identification of Crystal Structure

Figure 8:
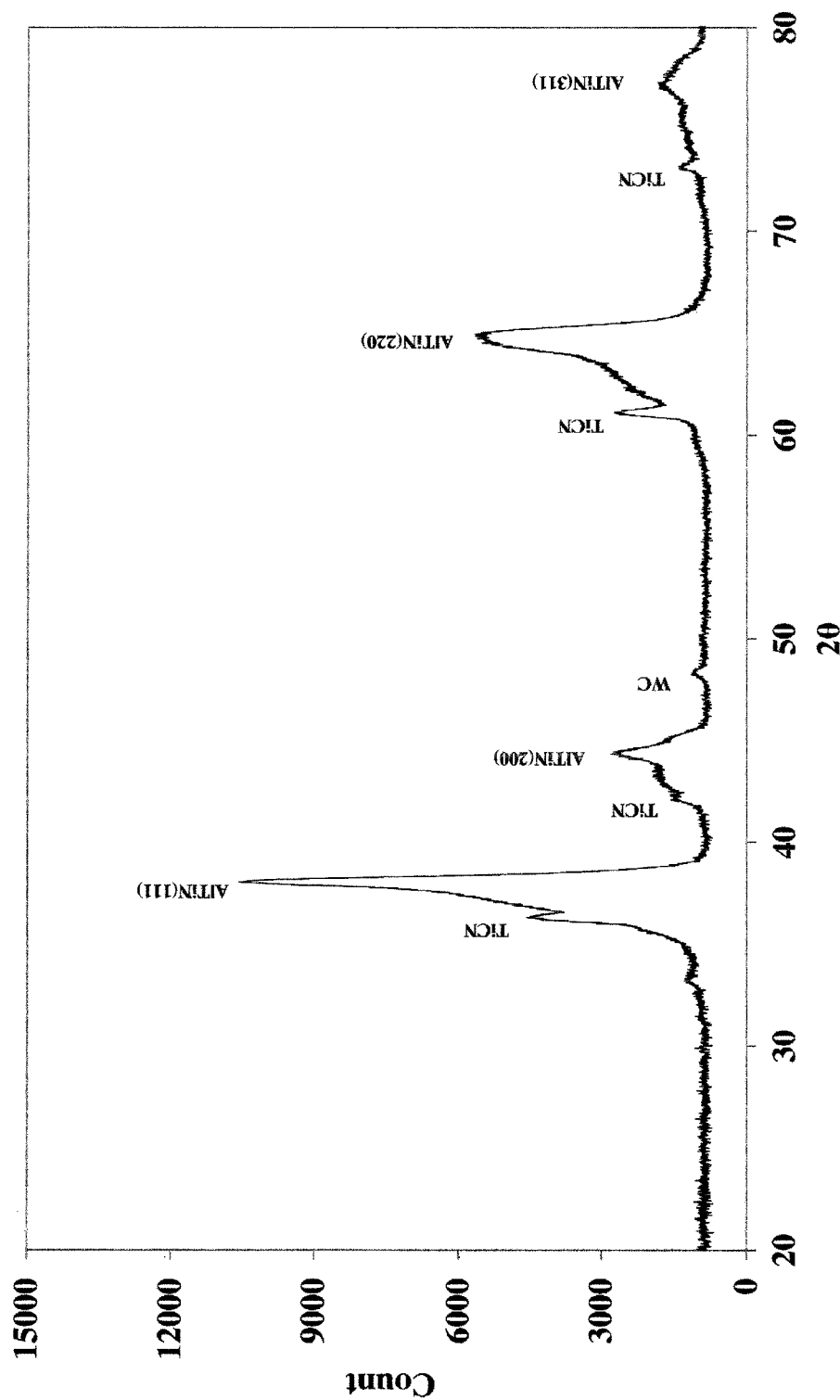
FIG. 8 is a graph showing an X-ray diffraction pattern of a hard coating in the hard-coated tool of Example 1.

To identify the crystal structure, CuKα$_1$ rays (wavelength λ: 0.15405 nm) were projected onto a hard coating surface on a rake face of the property-evaluating insert (SNMN120408) at tube voltage of 45 kV and tube current of 40 mA, by an X-ray diffraction apparatus (EMPYREAN available from PANalytical). The X-ray diffraction pattern obtained in a 2θ range of 20-80° is shown in FIG. 8. In this X-ray diffraction pattern, diffraction peaks of the Ti(CN) coating and diffraction peaks of the hard titanium aluminum nitride coating having an fcc structure were observed together with a diffraction peak of WC in the WC-based cemented carbide substrate. It is clear from the X-ray diffraction pattern of FIG. 8 that the hard titanium aluminum nitride coating of the present invention has a single structure of fcc.

(4) Microstructure (High-Al TiAlN and High-Ti TiAlN) of Hard Titanium Aluminum Nitride Coating On the fractured surface (hard titanium aluminum nitride coating, etc.) of each hard-coated tool, microstructure observation was conducted by SEM (S-4200 available from Hitachi, Ltd.) and a field-emission transmission electron microscope FE-TEM (JEM-2010F available from JEOL Ltd.), and mapping analysis was conducted by an energy-dispersive X-ray spectrometer EDS (UTW-type Si (Li) semiconductor detector available from NORAN) attached to JEM-2010F.

FIG. 1 is a SEM photograph (magnification: 10,000 times) of a fractured hard coating surface on a rake face of the property-evaluating insert (SNMN120408). It is clear that the hard titanium aluminum nitride coating had a columnar crystal structure.

Figure 2:
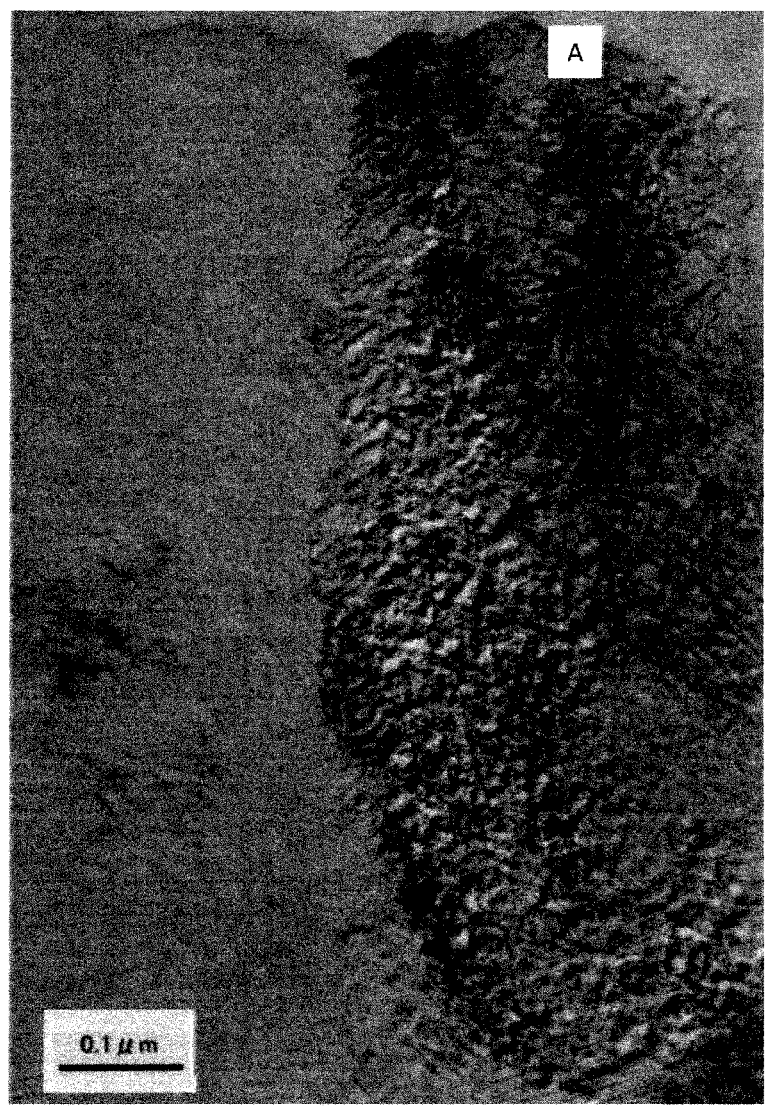
FIG. 2 is a transmission electron photomicrograph (TEM photograph, magnification: 40,000 times) showing a cross section of the hard-coated tool of Example 1.
Figure 4:
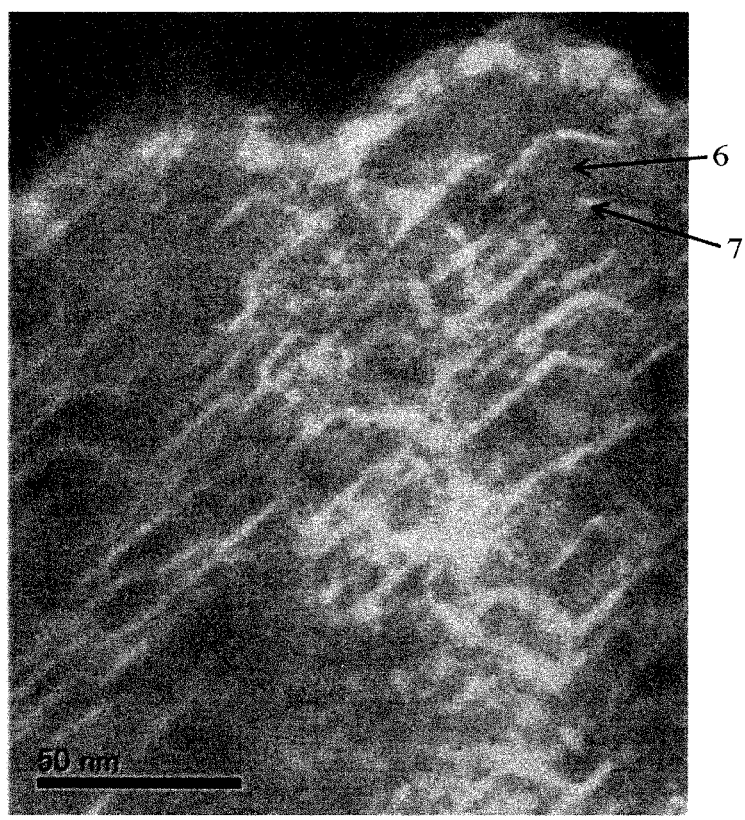
FIG. 4 is a dark-field STEM photograph (magnification: 800,000 times) enlargedly showing a portion A in FIG. 2.

FIG. 2 is a TEM photograph (magnification: 40,000 times) of the hard titanium aluminum nitride coating, FIG. 3 is a TEM photograph (magnification: 200,000 times) enlargedly showing a portion A in FIG. 2, and FIG. 4 is a cross-sectional, dark-field STEM image (magnification: 800,000 times) enlargedly showing the portion A in FIG. 2. FIGS. 3 and 4 reveal that the hard titanium aluminum nitride coating had a first relatively flat crystal phase 6 (pale gray portion B), and a second thin-film-like (network-like) crystal phase 7, the first crystal phase 6 being surrounded by the second crystal phase 7 (dark gray or black portion C). FIG. 3 reveals that that the first crystal phase 6 had an average longitudinal cross section diameter Dav of 12 nm and an average transverse cross section diameter Daw of 40 nm.

Figure 5:
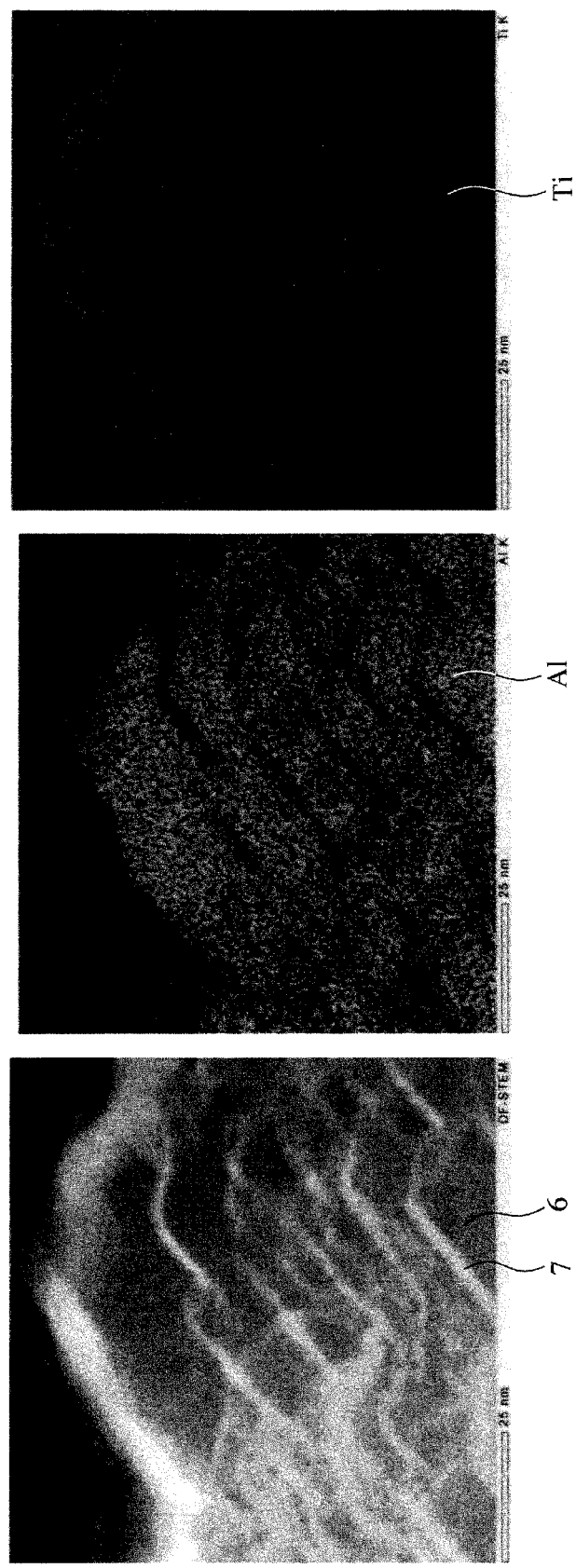
FIG. 5 is a view showing the EDS mapping analysis results of FIG. 4.

FIG. 5 corresponding to FIGS. 3 and 4 shows the mapping analysis (plane analysis) results of Al and Ti. FIG. 5 reveals that the first crystal phase 6 contained more Al and less Ti, while the second crystal phase 7 contained less Al and more Ti.

Figure 6:
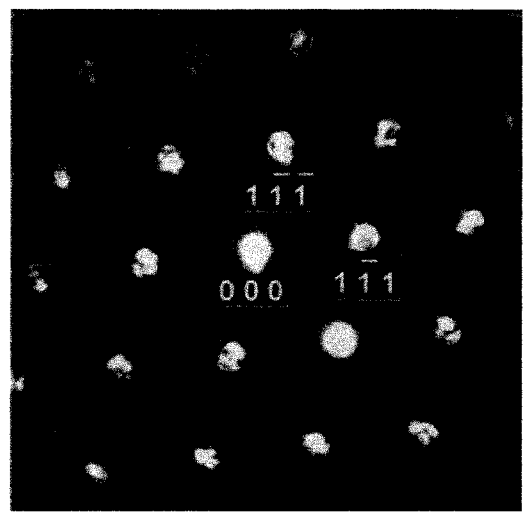
FIG. 6 is a view showing a nanobeam diffraction (NAD) image of high-Al TiAlN (portion B in FIG. 3) in the titanium aluminum nitride layer of Example 1.
Figure 7:
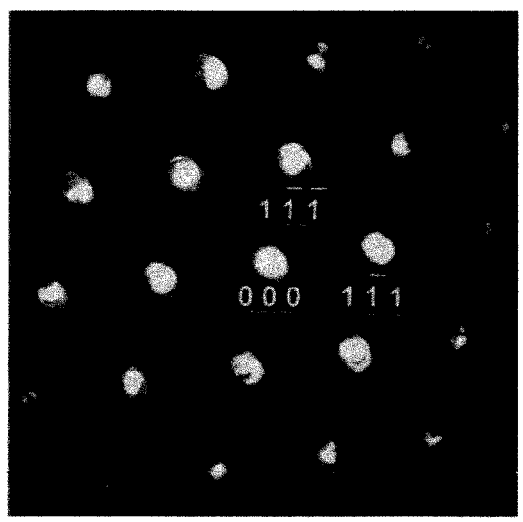
FIG. 7 is a view showing a nanobeam diffraction (NAD) image of high-Ti TiAlN (portion C in FIG. 3) in the of titanium aluminum nitride layer of Example 1.

FIG. 6 shows the nanobeam diffraction (NAD) of a portion B (high-Al TiAlN) in FIG. 3, and FIG. 7 shows the nanobeam diffraction (NAD) of a portion C (high-Ti TiAlN) in FIG. 3. The nanobeam diffraction conditions in JEM-2010F were acceleration voltage of 200 kV and camera length of 50 cm in portions B and C. It was found from FIGS. 6 and 7 that both of the first crystal phase (high-Al TiAlN) and the second crystal phase (high-Ti TiAlN) had a fcc structure.

It was found from FIGS. 3-7 that the first relatively flat crystal phase of high-Al TiAlN having an fcc structure was surrounded by the second crystal phase of thin, network-like, high-Ti TiAlN having an fcc structure.

(6) Measurement of Composition

In a cross section of the property-evaluating insert (SNMN120408), the composition of the hard titanium aluminum nitride coating was measured at five arbitrary points at its thickness-direction center by an electron probe microanalyzer EPMA (JXA-8500F available from JEOL, Ltd.), under the conditions of acceleration voltage of 10 kV, irradiation current of 0.05 A, and a beam diameter of 0.5 μm. The measured values were arithmetically averaged to determine the composition of the hard titanium aluminum nitride coating. The results are shown in Table 2.

In a cross section of the hard coating of the property-evaluating insert (SNMN120408), the compositions of high-Al TiAlN grains and high-Ti TiAlN grains in the hard titanium aluminum nitride coating were analyzed at five arbitrary points at a thickness-direction center of the above coating, by an energy-dispersive X-ray spectrometer EDS [UTW-type Si (Li) semiconductor detector available from NORAN, beam diameter: about 1 nm] attached to FE-TEM (JEM-2010F), and the measured values were arithmetically averaged. The results are shown in Table 3.

(7) Measurement of Hardness

The surface hardness of the hard coating was measured 5 times by a nanoindentation method using a nanoindentation hardness tester (ENT-1100 available from Elionix Inc.) with a Si single crystal as a standard sample, at a maximum load of 4900 mN, and a load speed of 49 mN/second, for a keeping time of 1 second, and arithmetically averaged. The results are shown in Table 2.

(8) Evaluation of Performance

Figure 10:
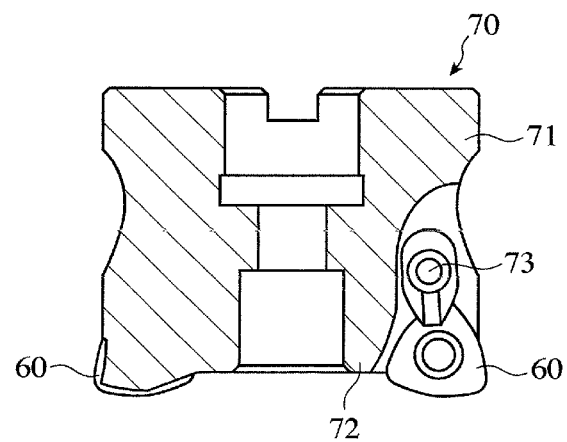
FIG. 10 is a schematic view showing an indexable rotary cutting tool, to which milling inserts are attached.

Each milling insert 60 was fixed to a tip portion 72 of a tool body 71 of the indexable rotary cutting tool (ASRT5063R-4) 70 shown in FIG. 10 by a setscrew 73, to evaluate the tool life of the hard coating under the following milling conditions. The flank wear width of the hard coating was measured by an optical microscope (magnification: 100 times). The tool life is expressed by the total cutting length when the maximum wear width of the flank exceeded 0.350 mm. The results are shown in Table 4.
Work: SCM440 having hardness of 32HRC,
Machining method: Milling,
Insert shape: WDNT140520-B,
Cutting speed: 175 m/minute,
Number of revolution: 885 rpm,
Feed speed per one tooth: 1.50 mm/tooth,
Feed speed: 5310 mm/minute,
Axial cutting depth: 1.0 mm,
Radial cutting depth: 40 mm, and
Cutting method: Dry cutting.

Examples 2-18

Each hard-coated tool (milling insert) was produced in the same manner as in Example 1 except for changing the coating conditions of the hard titanium aluminum nitride coating as shown in Tables 1-1 and 1-2, and its properties and tool lives were evaluated. With respect to the hard titanium aluminum nitride coating of each Example, the measurement results of composition, crystal structure and form, thickness and hardness, as well as an average lateral cross section diameter of columnar crystals are shown in Table 2. The measurement results of composition, crystal structure, Dav and Daw of high-Al TiAlN and the composition and crystal structure of high-Ti TiAlN in each Example are shown in Table 3. The observation results of microstructure of high-Al TiAlN, etc. and the tool life in each Example are shown in Table 4. It is clear from Tables 2-4 that each hard titanium aluminum nitride coating of Examples 2-18 has a columnar crystal structure in which high-Al TiAlN having an fcc structure is surrounded by network-like, high-Ti TiAlN having an fcc structure, as well as a good tool life, as in Example 1.

Example 19

With the same milling insert substrates of WC-based cemented carbide as in Example 1 set in the CVD furnace 1, a mixture gas comprising 0.37% by volume of a $TiCl_4$ gas, 54.34% by volume of an $N_2$ gas and 45.29% by volume of an $H_2$ gas at a flow rate of 55.2 L/minute was flown into the CVD furnace at 800° C. and 16 kPa, to form a titanium nitride coating having an average thickness of 0.2 μm on the insert substrate.

A 5-μm-thick hard titanium aluminum nitride coating having a composition represented by $Ti_{0.10}Al_{0.40}N_{0.50}$ (atomic ratio) was formed in the same manner as in Example 1, except for introducing the mixture gas A through the second nozzles 12a of the second pipe 12 and the mixture gas B through the first nozzles 11a, 11a of the first pipes 11, 11 into the CVD furnace 1, thereby producing the hard-coated tool of the present invention (milling insert).

The properties and tool lives of the hard-coated tools were evaluated in the same manner as in Example 1. The measurement results of the composition, crystal structure and form, thickness and hardness of the hard titanium aluminum nitride coating, and the average lateral cross section diameter of columnar crystals are shown in Table 2. The measurement results of the composition, crystal structure, Dav and Daw of high-Al TiAlN, and the composition and crystal structure of high-Ti TiAlN are shown in Table 3. The observed microstructure of high-Al TiAlN, etc. and the tool life are shown in Table 4. It is clear from Tables 2-4 that the hard titanium aluminum nitride coating of Example 19 had a columnar crystal structure, in which high-Al TiAlN having an fcc structure was surrounded by network-like, high-Ti TiAlN having an fcc structure, as well as a good tool life, as in Example 1.

Comparative Example 1

After forming a titanium carbonitride coating in the same manner as in Example 1, the nozzles 11a, 12a shown in FIG.

13 (center angle θ: 180°, and $H_1=H_2$) were used to introduce mixture gases A, B. A 5-μm-thick hard titanium aluminum nitride coating was formed by chemical vapor deposition under the conditions (850° C. and 6 kPa) shown in Table 1 in the same manner as in Example 1, except for introducing a mixture gas A comprising 40.00% by volume of an $H_2$ gas, 25.00% by volume of an $N_2$ gas, 0.35% by volume of a $TiCl_4$ gas and 1.00% by volume of an $AlCl_3$ gas through the first nozzles 11a, and a mixture gas B comprising 11.65% by volume of an $H_2$ gas, 20.00% by volume of an $N_2$ gas and 2.00% by volume of an $NH_3$ gas through the second nozzles 12a, into the CVD furnace 1 at a flow rate of 58.00 L/minute. The properties and tool lives of the resultant hard-coated tools (milling inserts) were elevated in the same manner as in Example 1. The results are shown in Tables 2-4.

Comparative Example 2

After forming a titanium carbonitride coating in the same manner as in Example 1, the nozzles 11a, 12a shown in FIG. 13 (center angle θ: 180°, and $H_1=H_2$) were used to introduce mixture gases A, B. A 5-μm-thick hard titanium aluminum nitride coating was formed by chemical vapor deposition under the conditions (800° C. and 1 kPa) shown in Table 1 in the same manner as in Example 1, except for introducing a mixture gas A comprising 65.93% by volume of an $H_2$ gas, 18.84% by volume of an Ar gas, 0.16% by volume of a $TiCl_4$ gas and 0.94% by volume of an $AlCl_3$ gas through the first nozzles 11a, and a mixture gas B comprising 9.42% by volume of an $N_2$ gas and 4.71% by volume of an $NH_3$ gas through the second nozzles 12a, into the CVD furnace 1 at a flow rate of 63.71 L/minute. The properties and tool lives of the resultant hard-coated tools (milling inserts) were evaluated in the same manner as in Example 1. The evaluation results are shown in Tables 2-4.

Comparative Example 3

A hard titanium aluminum nitride coating was formed in the same manner as in Example 1, except that the nozzles 11a, 12a shown in FIG. 13 (center angle θ: 180°, and $H_1=H_2$) were used to introduce mixture gases A, B, and that the starting material gas compositions and coating conditions (800° C. and 1 kPa) shown in Table 1 were used. The properties and tool lives of the resultant hard-coated tools (milling inserts) were evaluated in the same manner as in Example 1. The results are shown in Tables 2-4.

As shown in Table 4, in any hard titanium aluminum nitride coatings of Comparative Examples 1-3, high-Al TiAlN was not surrounded by network-like, high-Ti TiAlN. The hard titanium aluminum nitride coatings of Comparative Examples 1-2 had granular crystal structures, though they had an fcc structure. The hard titanium aluminum nitride coating of Comparative Example 3 had a granular crystal structure in which hard titanium aluminum nitride layers having an fcc structure and hard titanium aluminum nitride layers having an fcc+hcp structure were alternately laminated.

TABLE 1-1

| No. | Temp. (° C.)[1] | Reaction Pressure (kPa) | Mixture-Gas-Ejecting Nozzle | | |
|---|---|---|---|---|---|
| | | | Apparatus | Mixture Gas A | Mixture Gas B |
| Example 1 | 800 | 4 | FIG. 12(a) | First Nozzle | Second Nozzle |
| Example 2 | 800 | 4 | FIG. 12(a) | First Nozzle | Second Nozzle |
| Example 3 | 800 | 4 | FIG. 12(a) | First Nozzle | Second Nozzle |
| Example 4 | 800 | 4 | FIG. 12(a) | First Nozzle | Second Nozzle |
| Example 5 | 800 | 4 | FIG. 12(a) | First Nozzle | Second Nozzle |
| Example 6 | 800 | 4 | FIG. 12(a) | First Nozzle | Second Nozzle |
| Example 7 | 800 | 4 | FIG. 12(a) | First Nozzle | Second Nozzle |
| Example 8 | 800 | 4 | FIG. 12(a) | First Nozzle | Second Nozzle |
| Example 9 | 800 | 4 | FIG. 12(a) | First Nozzle | Second Nozzle |
| Example 10 | 800 | 4 | FIG. 12(a) | First Nozzle | Second Nozzle |
| Example 11 | 800 | 4 | FIG. 12(a) | First Nozzle | Second Nozzle |
| Example 12 | 800 | 3 | FIG. 12(a) | First Nozzle | Second Nozzle |
| Example 13 | 800 | 5 | FIG. 12(a) | First Nozzle | Second Nozzle |
| Example 14 | 750 | 4 | FIG. 12(a) | First Nozzle | Second Nozzle |
| Example 15 | 830 | 4 | FIG. 12(a) | First Nozzle | Second Nozzle |
| Example 16 | 800 | 4 | FIG. 12(a) | First Nozzle | Second Nozzle |
| Example 17 | 800 | 4 | FIG. 12(a) | First Nozzle | Second Nozzle |
| Example 18 | 800 | 4 | FIG. 12(a) | First Nozzle | Second Nozzle |
| Example 19 | 800 | 4 | FIG. 12(a) | Second Nozzle | First Nozzle |
| Com. Ex. 1 | 850 | 6 | FIG. 13 | First Nozzle | Second Nozzle |
| Com. Ex. 2 | 800 | 1 | FIG. 13 | First Nozzle | Second Nozzle |
| Com. Ex. 3 | 800 | 1 | FIG. 13 | First Nozzle | Second Nozzle |

Note:
[1] Coating-forming temperature.

TABLE 1-2

| | Starting Material Gas Composition (% by volume) | | | | | | | | |
|---|---|---|---|---|---|---|---|---|---|
| | Mixture Gas A | | | | | Mixture Gas B | | | $H_2(A)/$ |
| No. | $H_2$ | $N_2$ | Ar | $TiCl_4$ | $AlCl_3$ | $H_2$ | $N_2$ | $NH_3$ | $H_2(B)^{(2)}$ |
| Example 1 | 52.51 | 7.50 | 0.00 | 0.15 | 0.45 | 30.76 | 7.50 | 1.13 | 1.71 |
| Example 2 | 60.26 | 6.28 | 0.00 | 0.13 | 0.38 | 25.74 | 6.28 | 0.93 | 2.34 |
| Example 3 | 58.75 | 12.77 | 0.00 | 0.26 | 0.77 | 12.77 | 12.77 | 1.91 | 4.60 |

TABLE 1-2-continued

| | Starting Material Gas Composition (% by volume) | | | | | | | | |
|---|---|---|---|---|---|---|---|---|---|
| | Mixture Gas A | | | | | Mixture Gas B | | | H$_2$(A)/ |
| No. | H$_2$ | N$_2$ | Ar | TiCl$_4$ | AlCl$_3$ | H$_2$ | N$_2$ | NH$_3$ | H$_2$(B)$^{(2)}$ |
| Example 4 | 38.19 | 21.82 | 0.00 | 0.11 | 0.33 | 22.37 | 16.37 | 0.81 | 1.71 |
| Example 5 | 56.77 | 4.87 | 0.00 | 0.17 | 0.49 | 33.25 | 3.24 | 1.21 | 1.71 |
| Example 6 | 52.58 | 7.51 | 0.00 | 0.02 | 0.45 | 30.80 | 7.51 | 1.13 | 1.71 |
| Example 7 | 52.43 | 7.49 | 0.00 | 0.31 | 0.45 | 30.71 | 7.49 | 1.12 | 1.71 |
| Example 8 | 52.67 | 7.52 | 0.00 | 0.15 | 0.15 | 30.85 | 7.52 | 1.14 | 1.71 |
| Example 9 | 52.49 | 7.50 | 0.00 | 0.15 | 0.50 | 30.74 | 7.50 | 1.12 | 1.71 |
| Example 10 | 52.32 | 7.47 | 0.00 | 0.15 | 0.45 | 30.64 | 7.47 | 1.50 | 1.71 |
| Example 11 | 52.71 | 7.53 | 0.00 | 0.15 | 0.45 | 30.87 | 7.53 | 0.76 | 1.71 |
| Example 12 | 52.51 | 7.50 | 0.00 | 0.15 | 0.45 | 30.76 | 7.50 | 1.13 | 1.71 |
| Example 13 | 52.51 | 7.50 | 0.00 | 0.15 | 0.45 | 30.76 | 7.50 | 1.13 | 1.71 |
| Example 14 | 52.51 | 7.50 | 0.00 | 0.15 | 0.45 | 30.76 | 7.50 | 1.13 | 1.71 |
| Example 15 | 52.51 | 7.50 | 0.00 | 0.15 | 0.45 | 30.76 | 7.50 | 1.13 | 1.71 |
| Example 16 | 27.43 | 35.78 | 0.00 | 0.12 | 0.29 | 11.93 | 23.85 | 0.60 | 2.30 |
| Example 17 | 39.36 | 23.85 | 0.00 | 0.12 | 0.29 | 11.93 | 23.85 | 0.60 | 3.30 |
| Example 18 | 27.47 | 35.82 | 0.00 | 0.12 | 0.29 | 11.94 | 23.88 | 0.48 | 2.30 |
| Example 19 | 52.51 | 7.50 | 0.00 | 0.15 | 0.45 | 30.76 | 7.50 | 1.13 | 1.71 |
| Com. Ex. 1 | 40.00 | 25.00 | 0.00 | 0.35 | 1.00 | 11.65 | 20.00 | 2.00 | 3.43 |
| Com. Ex. 2 | 65.93 | 0.00 | 18.84 | 0.16 | 0.94 | 0.00 | 9.42 | 4.71 | — |
| Com. Ex. 3 | 58.20 | 20.10 | 0.00 | 0.50 | 1.30 | 0.00 | 18.10 | 1.80 | — |

Note:
$^{(2)}$A volume ratio of an H$_2$ gas in the mixture gas A to an H$_2$ gas in the mixture gas B.

TABLE 2

| | Hard Titanium Aluminum Nitride Coating | | | | | | | |
|---|---|---|---|---|---|---|---|---|
| | Composition (atomic %) | | | Crystal | Crystal | Daw$^{(1)}$ | Thickness | Hardness |
| No. | Ti | Al | N | Structure | Form | (μm) | (μm) | (GPa) |
| Example 1 | 15 | 33 | 52 | fcc | Columnar | 0.66 | 5 | 39 |
| Example 2 | 10 | 39 | 51 | fcc | Columnar | 0.40 | 5 | 40 |
| Example 3 | 7 | 41 | 52 | fcc | Columnar | 0.98 | 5 | 35 |
| Example 4 | 8 | 41 | 51 | fcc | Columnar | 0.25 | 5 | 40 |
| Example 5 | 18 | 32 | 50 | fcc | Columnar | 0.28 | 5 | 40 |
| Example 6 | 4 | 44 | 52 | fcc | Columnar | 0.10 | 5 | 42 |
| Example 7 | 22 | 26 | 52 | fcc | Columnar | 1.00 | 5 | 35 |
| Example 8 | 22 | 27 | 51 | fcc | Columnar | 0.24 | 5 | 41 |
| Example 9 | 17 | 33 | 50 | fcc | Columnar | 0.88 | 5 | 38 |
| Example 10 | 13 | 35 | 52 | fcc | Columnar | 0.75 | 5 | 37 |
| Example 11 | 14 | 35 | 51 | fcc | Columnar | 1.20 | 5 | 35 |
| Example 12 | 12 | 38 | 50 | fcc | Columnar | 0.25 | 5 | 39 |
| Example 13 | 13 | 35 | 52 | fcc | Columnar | 0.96 | 5 | 38 |
| Example 14 | 14 | 38 | 48 | fcc | Columnar | 0.15 | 5 | 35 |
| Example 15 | 18 | 27 | 55 | fcc | Columnar | 1.12 | 5 | 35 |
| Example 16 | 15 | 37 | 48 | fcc | Columnar | 0.85 | 5 | 37 |
| Example 17 | 19 | 30 | 51 | fcc | Columnar | 0.95 | 5 | 36 |
| Example 18 | 12 | 35 | 53 | fcc | Columnar | 0.52 | 5 | 34 |
| Example 19 | 10 | 40 | 50 | fcc | Columnar | 0.54 | 5 | 38 |
| Com. Ex. 1 | 12 | 38 | 50 | fcc | Granular | —$^{(2)}$ | 5 | 34 |
| Com. Ex. 2 | 6 | 44 | 50 | fcc | Granular | —$^{(2)}$ | 5 | 33 |
| Com. Ex. 3 | 4.5 | 45.5 | 50 | fcc + hcp | Granular | —$^{(2)}$ | 5 | 32 |

Note:
$^{(1)}$Daw means an average transverse cross section diameter of columnar crystals.
$^{(2)}$Not measured.

TABLE 3

| | High-Al TiAlN | | | | | High-Ti TiAlN | | |
|---|---|---|---|---|---|---|---|---|
| | (Ti$_{x1}$, Al$_{y1}$)N (atomic ratio) | | Crystal | Dav$^{(1)}$ | Daw$^{(2)}$ | (Ti$_{x2}$, Al$_{y2}$)N (atomic ratio) | | Crystal |
| No. | x$_1$ | y$_1$ | Structure | (nm) | (nm) | x$_2$ | y$_2$ | Structure |
| Example 1 | 0.02 | 0.98 | fcc | 12 | 40 | 0.67 | 0.33 | fcc |
| Example 2 | 0.01 | 0.99 | fcc | 10 | 32 | 0.72 | 0.28 | fcc |
| Example 3 | 0.08 | 0.92 | fcc | 48 | 262 | 0.85 | 0.15 | fcc |

TABLE 3-continued

| | High-Al TiAlN | | | | | High-Ti TiAlN | | |
|---|---|---|---|---|---|---|---|---|
| | $(Ti_{x1}, Al_{y1})N$ (atomic ratio) | | Crystal | $Dav^{(1)}$ | $Daw^{(2)}$ | $(Ti_{x2}, Al_{y2})N$ (atomic ratio) | | Crystal |
| No. | $x_1$ | $y_1$ | Structure | (nm) | (nm) | $x_2$ | $y_2$ | Structure |
| Example 4 | 0.01 | 0.99 | fcc | 28 | 85 | 0.52 | 0.48 | fcc |
| Example 5 | 0.04 | 0.96 | fcc | 26 | 93 | 0.82 | 0.18 | fcc |
| Example 6 | 0.005 | 0.995 | fcc | 2 | 30 | 0.50 | 0.50 | fcc |
| Example 7 | 0.10 | 0.90 | fcc | 32 | 162 | 0.90 | 0.10 | fcc |
| Example 8 | 0.09 | 0.91 | fcc | 21 | 62 | 0.86 | 0.14 | fcc |
| Example 9 | 0.03 | 0.97 | fcc | 28 | 84 | 0.60 | 0.40 | fcc |
| Example 10 | 0.02 | 0.98 | fcc | 26 | 75 | 0.63 | 0.37 | fcc |
| Example 11 | 0.08 | 0.92 | fcc | 30 | 150 | 0.88 | 0.12 | fcc |
| Example 12 | 0.02 | 0.98 | fcc | 8 | 22 | 0.61 | 0.39 | fcc |
| Example 13 | 0.03 | 0.97 | fcc | 22 | 80 | 0.75 | 0.25 | fcc |
| Example 14 | 0.06 | 0.94 | fcc | 5 | 20 | 0.80 | 0.20 | fcc |
| Example 15 | 0.07 | 0.93 | fcc | 50 | 300 | 0.82 | 0.18 | fcc |
| Example 16 | 0.03 | 0.97 | fcc | 18 | 56 | 0.70 | 0.30 | fcc |
| Example 17 | 0.09 | 0.91 | fcc | 25 | 68 | 0.62 | 0.38 | fcc |
| Example 18 | 0.08 | 0.92 | fcc | 43 | 132 | 0.55 | 0.45 | fcc |
| Example 19 | 0.01 | 0.99 | fcc | 38 | 212 | 0.71 | 0.29 | fcc |
| Com. Ex. 1 | —(3) | —(3) | —(3) | —(3) | —(3) | —(3) | —(3) | —(3) |
| Com. Ex. 2 | —(3) | —(3) | —(3) | —(3) | —(3) | —(3) | —(3) | —(3) |
| Com. Ex. 3 | —(3) | —(3) | —(3) | —(3) | —(3) | —(3) | —(3) | —(3) |

Note:
(1) Dav means an average longitudinal cross section diameter.
(2) Daw means an average transverse cross section diameter.
(3) No.

TABLE 4

| No. | Microstructure | Tool Life (m)$^{(1)}$ |
|---|---|---|
| Example 1 | High-Al TiAlN surrounded by network-like, high-Ti TiAlN | 60 |
| Example 2 | High-Al TiAlN surrounded by network-like, high-Ti TiAlN | 55 |
| Example 3 | High-Al TiAlN surrounded by network-like, high-Ti TiAlN | 40 |
| Example 4 | High-Al TiAlN surrounded by network-like, high-Ti TiAlN | 50 |
| Example 5 | High-Al TiAlN surrounded by network-like, high-Ti TiAlN | 50 |
| Example 6 | High-Al TiAlN surrounded by network-like, high-Ti TiAlN | 40 |
| Example 7 | High-Al TiAlN surrounded by network-like, high-Ti TiAlN | 40 |
| Example 8 | High-Al TiAlN surrounded by network-like, high-Ti TiAlN | 40 |
| Example 9 | High-Al TiAlN surrounded by network-like, high-Ti TiAlN | 55 |
| Example 10 | High-Al TiAlN surrounded by network-like, high-Ti TiAlN | 55 |
| Example 11 | High-Al TiAlN surrounded by network-like, high-Ti TiAlN | 40 |
| Example 12 | High-Al TiAlN surrounded by network-like, high-Ti TiAlN | 55 |
| Example 13 | High-Al TiAlN surrounded by network-like, high-Ti TiAlN | 55 |
| Example 14 | High-Al TiAlN surrounded by network-like, high-Ti TiAlN | 40 |
| Example 15 | High-Al TiAlN surrounded by network-like, high-Ti TiAlN | 40 |
| Example 16 | High-Al TiAlN surrounded by network-like, high-Ti TiAlN | 55 |
| Example 17 | High-Al TiAlN surrounded by network-like, high-Ti TiAlN | 50 |
| Example 18 | High-Al TiAlN surrounded by network-like, high-Ti TiAlN | 40 |
| Example 19 | High-Al TiAlN surrounded by network-like, high-Ti TiAlN | 55 |
| Com. Ex. 1 | TiAlN having different Al contents alternately laminated | 15 |
| Com. Ex. 2 | TiAlN having different Al contents alternately partially laminated | 10 |
| Com. Ex. 3 | TiAlN having different Al contents alternately laminated | 10 |

Note:
(1) Expressed by the cutting distance.

Each hard-coated tool (milling insert) of Examples 1-19 had a tool life of 40 m or more (expressed by cutting distance), as long as 2 times or more those of Comparative Examples 1-3. Such high performance appears to be achieved by excellent wear resistance and oxidation resistance of each hard-coated tool (milling insert) of Examples 1-19, which were obtained by the above characteristic microstructure of the hard titanium aluminum nitride coating.

On the other hand, the hard titanium aluminum nitride coating of Comparative Example 1 having a granular structure, in which TiAlN layers having different Al contents were alternately laminated, suffered rapid oxidation because oxygen intruded through crystal grain boundaries at high temperatures. As a result, the hard-coated tool of Comparative Example 1 suffered rapid crater wear, resulting in a short life. The tool of Comparative Example 2 having a hard titanium aluminum nitride coating having a granular structure, in which TiAlN layers having different Al contents were partially laminated, had poor oxidation resistance at high temperatures as in Comparative Example 1, resulting in a short life. Because the fcc structure was rapidly converted to the hcp structure in the hard titanium aluminum nitride coating of Comparative Example 3 at high temperatures, the coating had lower hardness with interlayer delamination, so that the tool having such coating had a short life.

DESCRIPTION OF REFERENCE NUMERALS

1: CVD furnace
2: Chamber
3: Heater
4: Shelf
4a: Center opening of shelve
5: Reaction vessel
6: First crystal phase (pale gray portion)
7: Second thin-film-like (network-like) crystal phase (dark gray or black portion)
11: First pipe
11a: Nozzle of first pipe
12: Second pipe
12a: Nozzle of second pipe
13: Discharge pipe
20: Insert substrate
30, 40, 50, 80: Assembly of first and second pipes
60: Milling insert
70: Indexable rotary cutting tool
71: Tool body
72: Tip portion
73: Setscrew

What is claimed is:

1. A hard titanium aluminum nitride coating having a columnar crystal structure, and comprising high-Al TiAlN having an fcc structure, which has a composition represented by $(Ti_{x_1}, Al_{y_1})N$, wherein $x_1$ and $y_1$ are numbers meeting $x_1=0.005$-$0.1$, and $y_1=0.995$-$0.9$ by atomic ratio, and network-like, high-Ti TiAlN having an fcc structure, which has a composition represented by $(Ti_{x_2}, Al_{y_2})N$, wherein $x_2$ and $y_2$ are numbers meeting $x_2=0.5$-$0.9$, and $y_2=0.5$-$0.1$ by atomic ratio; said high-Al TiAlN being surrounded by said network-like, high-Ti TiAlN, wherein said network-like means that said high-Ti TiAlN is distributed in a network form in a photomicrograph.

2. The hard titanium aluminum nitride coating according to claim 1, wherein said high-Al TiAlN has an average longitudinal cross section diameter of 2-50 nm and an average transverse cross section diameter of 10-300 nm.

3. The hard titanium aluminum nitride coating according to claim 1, wherein said columnar crystal has an average lateral cross section diameter of 0.1-1.2 μm.

4. A hard-coated tool having a hard titanium aluminum nitride coating formed on a substrate, wherein said hard titanium aluminum nitride coating has a columnar crystal structure, and comprises high-Al TiAlN having an fcc structure, which has a composition represented by $(Ti_{x_1}, Al_{y_1})N$, wherein $x_1$ and $y_1$ are numbers meeting $x_1=0.005$-$0.1$, and $y_1=0.995$-$0.9$ by atomic ratio, and network-like, high-Ti TiAlN having an fcc structure, which has a composition represented by $(Ti_{x_2}, Al_{y_1})N$, wherein $x_2$ and $y_2$ are numbers meeting $x_2=0.5$-$0.9$, and $y_2=0.5$-$0.1$ by atomic ratio; said high-Al TiAlN being surrounded by said network-like, high-Ti TiAlN, wherein said network-like means that said high-Ti TiAlN is distributed in a network form in a photomicrograph.

5. The hard-coated tool according to claim 4, wherein said high-Al TiAlN has an average longitudinal cross section diameter of 2-50 nm and an average transverse cross section diameter of 10-300 nm.

6. The hard-coated tool according to claim 4, wherein said columnar crystal has an average lateral cross section diameter of 0.1-1.2 μm.

7. A method for producing a hard titanium aluminum nitride coating by chemical vapor deposition, comprising
(1) using a mixture gas A comprising a $TiCl_4$ gas, an $AlCl_3$ gas, an $N_2$ gas, and an $H_2$ gas, and a mixture gas B comprising an $NH_3$ gas, an $N_2$ gas, and an $H_2$ gas as starting material gases;
(2) rotating first and second nozzles arranged with different distances from a rotation axis; and
(3) ejecting said mixture gas A and said mixture gas B separately from said first and second nozzles.

8. The method for producing a hard titanium aluminum nitride coating according to claim 7, wherein with the total amount of said mixture gases A and B as 100% by volume, the composition of said mixture gas A comprises 0.02-0.31% by volume of a $TiCl_4$ gas, 0.15-0.8% by volume of an $AlCl_3$ gas, and 3-40% by volume of an $N_2$ gas, the balance being an $H_2$ gas, and the composition of said mixture gas B comprises 0.4-1.9% by volume of an $NH_3$ gas, and 2-26% by volume of an $N_2$ gas, the balance being an $H_2$ gas; and wherein a volume ratio $H_2(A)/H_2(B)$ of the $H_2$ gas in said mixture gas A to the $H_2$ gas in said mixture gas B is 1-5.

9. The method for producing a hard titanium aluminum nitride coating according to claim 7, wherein the distance $H_1$ from an opening of said first nozzle to said rotation axis is longer than the distance $H_2$ from an opening of said second nozzle to said rotation axis; and wherein said mixture gas A is ejected from said first nozzle, and said mixture gas B is ejected from said second nozzle.

10. The method for producing a hard titanium aluminum nitride coating according to claim 7, wherein the distance $H_1$ from an opening of said first nozzle to said rotation axis is longer than the distance $H_2$ from an opening of said second nozzle to said rotation axis; and wherein said mixture gas B is ejected from said first nozzle, and said mixture gas A is ejected from said second nozzle.

11. The method for producing a hard titanium aluminum nitride coating according to claim 9, wherein a ratio $H_1/H_2$ of the distance $H_1$ from an opening of said first nozzle to said rotation axis to the distance $H_2$ from an opening of said second nozzle to said rotation axis is in a range of 1.5-3.

12. The method for producing a hard titanium aluminum nitride coating according to claim 7, wherein the reaction pressure is 3-6 kPa, and the reaction temperature is 750-830° C.

13. A method for producing a hard-coated tool having a hard titanium aluminum nitride coating by chemical vapor deposition, comprising
(1) using a mixture gas A comprising a $TiCl_4$ gas, an $AlCl_3$ gas, an $N_2$ gas, and an $H_2$ gas, and a mixture gas B comprising an $NH_3$ gas, an $N_2$ gas, and an $H_2$ gas as starting material gases;
(2) rotating first and second nozzles arranged with different distances from a rotation axis;
(3) disposing a tool substrate around said first and second nozzles; and
(4) ejecting said mixture gas A and said mixture gas B separately from said first and second nozzles.

14. The method for producing a hard-coated tool according to claim 13, wherein with the total amount of said mixture gases A and B as 100% by volume, the composition of said mixture gas A comprises 0.02-0.31% by volume of a $TiCl_4$ gas, 0.15-0.8% by volume of an $AlCl_3$ gas, and 3-40% by volume of an $N_2$ gas, the balance being an $H_2$ gas, and the composition of said mixture gas B comprises 0.4-1.9% by volume of an $NH_3$ gas, and 2-26% by volume of an $N_2$ gas, the balance being an $H_2$ gas; and wherein a volume ratio $H_2(A)/H_2(B)$ of the $H_2$ gas in said mixture gas A to the $H_2$ gas in said mixture gas B is 1-5.

15. The method for producing a hard-coated tool according to claim 13, wherein the distance $H_1$ from an opening of said first nozzle to said rotation axis is longer than the distance $H_2$ from an opening of said second nozzle to said rotation axis; and wherein said mixture gas A is ejected from said first nozzle, and said mixture gas B is ejected from said second nozzle.

16. The method for producing a hard-coated tool according to claim 13, wherein the distance $H_1$ from an opening of said first nozzle to said rotation axis is longer than the distance $H_2$ from an opening of said second nozzle to said rotation axis; and wherein said mixture gas B is ejected from said first nozzle, and said mixture gas A is ejected from said second nozzle.

17. The method for producing a hard-coated tool according to claim 15, wherein a ratio $H_1/H_2$ of the distance $H_1$ from an opening of said first nozzle to said rotation axis to the distance $H_2$ from an opening of said second nozzle to said rotation axis is in a range of 1.5-3.

18. The method for producing a hard-coated tool according to claim 13, wherein the reaction pressure is 3-6 kPa, and the reaction temperature is 750-830° C.

* * * * *